United States Patent
Sato et al.

(10) Patent No.: US 7,318,729 B2
(45) Date of Patent: Jan. 15, 2008

(54) SHEET-FORM CONNECTOR AND PRODUCTION METHOD AND APPLICATION THEREFOR

(75) Inventors: Katsumi Sato, Tokyo (JP); Kazuo Inoue, Tokyo (JP)

(73) Assignee: JSR Corporation, Tokyo (JP)

( * ) Notice: Subject to any disclaimer, the term of this patent is extended or adjusted under 35 U.S.C. 154(b) by 210 days.

(21) Appl. No.: 10/515,062

(22) PCT Filed: Oct. 24, 2003

(86) PCT No.: PCT/JP03/13618

§ 371 (c)(1),
(2), (4) Date: Nov. 19, 2004

(87) PCT Pub. No.: WO2004/038433

PCT Pub. Date: May 6, 2004

(65) Prior Publication Data

US 2005/0215086 A1 Sep. 29, 2005

(30) Foreign Application Priority Data

Oct. 28, 2002 (JP) ............................ 2002-313457

(51) Int. Cl.
*H01R 12/00* (2006.01)
*H05K 1/00* (2006.01)
(52) U.S. Cl. ..................... 439/66; 439/91; 439/591
(58) Field of Classification Search .................. 439/66, 439/91, 591
See application file for complete search history.

(56) References Cited

U.S. PATENT DOCUMENTS 5,531,021 A * 7/1996 Kolman et al. ............... 29/843
6,280,207 B1 * 8/2001 Sakata et al. ................ 439/91
6,338,629 B1 * 1/2002 Fisher et al. ................ 439/66

(Continued)

FOREIGN PATENT DOCUMENTS

JP 8-235935 9/1996

(Continued)

*Primary Examiner*—Hae Moon Hyeon
(74) *Attorney, Agent, or Firm*—Oblon, Spivak, McClelland, Maier & Neustadt, P.C.

(57) ABSTRACT

Disclosed herein are a sheet-like connector that electrode structures each having a front-surface electrode part small in diameter can be formed, a stable electrically connected state can be surely achieved even to a circuit device, on which electrodes have been formed at a small pitch, and the electrode structures are prevented from falling off from an insulating sheet to achieve high durability, and a production process and applications thereof.

The sheet-like connector of the invention has an insulating sheet and a plurality of electrode structures arranged in the insulating sheet and extending through in a thickness-wise direction of the insulating sheet. Each of the electrode structures is composed of a front-surface electrode part exposed to a front surfaces of the insulating sheet and projected from the front surface of the insulating sheet, a back-surface electrode part exposed to a back surface of the insulating sheet, a short circuit part continuously extending from the base end of the front-surface electrode part through the insulating sheet in the thickness-wise direction thereof and linked to the back-surface electrode part, and a holding part continuously extending from a base end portion of the front-surface electrode part outward along the front surface of the insulating sheet.

14 Claims, 22 Drawing Sheets

U.S. PATENT DOCUMENTS

| | | | |
|---|---|---|---|
| 6,551,112 B1 * | 4/2003 | Li et al. | 439/66 |
| 7,001,191 B2 * | 2/2006 | Nishizawa | 439/90 |
| 7,025,600 B2 * | 4/2006 | Higashi | 439/66 |
| 2001/0016436 A1 * | 8/2001 | Wimmer | 439/66 |

FOREIGN PATENT DOCUMENTS

| | | |
|---|---|---|
| JP | 2001-208776 | 8/2001 |
| JP | 2002-289277 | 10/2002 |

* cited by examiner

SHEET-FORM CONNECTOR AND PRODUCTION METHOD AND APPLICATION THEREFOR

TECHNICAL FIELD

The present invention relates to a sheet-like connector suitable for use in a probe device for conducting electric connection to a circuit, for example, an integrated circuit or the like in electrical inspection of the circuit, and a production process and applications thereof.

BACKGROUND ART

In electrical inspection of, for example, a wafer, on which a great number of integrated circuits have been formed, or a circuit device, such as an electronic part such as a semiconductor device, a probe for inspection having inspection electrodes arranged in accordance with a pattern corresponding to a pattern of electrodes to be inspected of a circuit device to be inspected is used. As such a probe for inspection, may be used that, on which inspection electrodes composed of pins or blades are arranged.

When the circuit device to be inspected is a wafer, on which a great number of integrated circuits have been formed, it is however necessary to arrange a very great number of inspection electrodes upon production of a probe for inspection for inspecting the wafer, so that such a probe for inspection becomes extremely expensive. In addition, when the pitch of electrodes to be inspected is small, the production itself of the probe for inspection becomes difficult. Further, since warpage generally occurs on wafers, and the condition of the warpage varies with individual products (wafers), it is difficult in practice to stably and surely bring each of inspection electrodes of the probe for inspection into contact with a great number of electrodes to be inspected in the wafer.

For the above reasons, in recent years, a probe comprising a circuit board for inspection, on one surface of which a plurality of inspection electrodes have been formed in accordance with a pattern corresponding to a pattern of electrodes to be inspected, an anisotropically conductive sheet arranged on one surface of the circuit board for inspection and a sheet-like connector which is formed by arranging, in a flexible insulating sheet, a plurality of electrode structures each extending through in a thickness-wise direction of the insulating sheet, and arranged on the anisotropically conductive sheet, has been proposed as a probe for inspection for inspecting integrated circuits formed on a wafer (see, for example, the following Prior Art 1).

FIG. 49 is a cross-sectional view illustrating the construction of a conventional exemplary probe for circuit inspection, which is equipped with a circuit board for inspection, an anisotropically conductive sheet and a sheet-like connector. In this probe for circuit inspection, is provided the circuit board 85 for inspection having, on one surface thereof, a great number of inspection electrodes 86 formed in accordance with a pattern corresponding to a pattern of electrodes to be inspected of a circuit board to be inspected. The sheet-like connector 90 is arranged on one surface of the circuit board 85 for inspection through the anisotropically conductive sheet 80.

The anisotropically conductive sheet 80 is a sheet exhibiting conductivity only in its thickness-wise direction or having pressure-sensitive conductive conductor parts exhibiting conductivity only in its thickness-wise direction when it is pressurized in the thickness-wise direction. As such anisotropically conductive sheets, those of various structures have been known. For example, the following Prior Art 2, and the like disclose an anisotropically conductive sheet (hereinafter referred to as "dispersion type anisotropically conductive sheet") obtained by uniformly dispersing metal particles in an elastomer, and the following Prior Art 3, and the like disclose an anisotropically conductive sheet (hereinafter referred to as "uneven distribution type anisotropically conductive sheet") obtained by unevenly distributing particles of a conductive magnetic substance in an elastomer to form a great number of conductive parts extending in a thickness-wise direction thereof and insulating parts for mutually insulating them. Further, the following Prior Art 4, and the like disclose an uneven distribution type anisotropically conductive sheet with a difference in level defined between the surface of each conductive part and an insulating part.

The sheet-like connector 90 has a flexible insulating sheet 91 composed of, for example a resin, and is formed by arranging, in this insulating sheet 91, a plurality of electrode structures 95 each extending in a thickness-wise direction of the insulating sheet in accordance with the pattern corresponding to the pattern of the electrodes to be inspected of the circuit board to be inspected. Each of the electrode structures 95 is formed by integrally connecting a projected front-surface electrode part 96 exposed to a front surface of the insulating sheet 91 and a plate-like back-surface electrode part 97 exposed to a back surface of the insulating sheet 91 to each other through a short circuit part 98 extending through in the thickness-wise direction of the insulating sheet 91.

Such a sheet-like connector 90 is generally produced in the following manner.

As illustrated in FIG. 50(a), a laminate material 90A obtained by forming a metal layer on one surface of an insulating sheet 91 is first provided, and through-holes 98H each extending through in a thickness-wise direction of the insulating sheet 91 are formed in the insulating sheet 91 as illustrated in FIG. 50(b).

As illustrated in FIG. 50(c), a resist film 93 is then formed on the metal layer 92 on the insulating sheet 91, and an electroplating treatment is conducted by using the metal layer 92 as a common electrode, whereby metal deposit is filled into the through-holes 98H in the insulating sheet 91 to form short circuit parts 98 integrally joined to the metal layer 92, and at the same time, projected front-surface electrode parts 96 integrally joined to the respective short circuit parts 98 are formed on the front surface of the insulating sheet 91.

Thereafter, the resist film 93 is removed from the metal layer 92, and as illustrated in FIG. 50(d), a resist film 94A is formed on the surface of the insulating sheet 91 including the front-surface electrode parts 96, and moreover resist film portions 94B are formed on the metal layer 92 in accordance with a pattern corresponding to a pattern of back-surface electrode parts to be formed. The metal layer 92 is subjected to an etching treatment to remove exposed portions of the metal layer 92, thereby forming back-surface electrode parts 97 as illustrated in FIG. 50(e), thus resulting in the formation of the electrode structures 95.

The resist film 94A formed on the insulating sheet 91 and front-surface electrode parts 96 is removed, and at the same time the resist film portions 94B formed on the back-surface electrode parts 97 are removed, thereby obtaining the sheet-like connector 90.

In the above-described probe for inspection, the front-surface electrode parts 96 of the electrode structures 95 in the sheet-like connector 90 are arranged on the surface of a circuit board to be inspected, for example, a wafer so as to be located on electrodes to be inspected of the wafer. In this state, the wafer is pressed by the probe for inspection, whereby the anisotropically conductive sheet 80 is pressed by the back-surface electrode parts 97 of the electrode structures 95 in the sheet-like connector 90, and in the anisotropically conductive sheet 80, conductive paths are thereby formed between the back-surface electrode parts 97 and the inspection electrodes 86 of the circuit board 85 for inspection in the thickness-wise direction of the anisotropically conductive sheet 80. As a result, electrical connection of the electrodes to be inspected of the wafer to the inspection electrodes 86 of the circuit board 85 for inspection is achieved. In this state, necessary electrical inspection as to the wafer is then performed.

According to such a probe for inspection, the anisotropically conductive sheet is deformed according to the degree of warpage of the wafer when the wafer is pressed by the probe for inspection, so that good electrical connection to a great number of the respective electrodes to be inspected in the wafer can be surely achieved.

However, the above-described probe for inspection involves the following problems.

In the step of forming the short circuit parts 98 and front-surface electrode parts 96 in the production process of the sheet-like connector, the metallic deposit by the electroplating isotropically grows. Therefore, in the resulting front-surface electrode part 96, a distance w from a periphery of the front-surface electrode part 96 to a periphery of the short circuit part 98 becomes equivalent to the projected height h of the front-surface electrode part 96 as illustrated in FIG. 51. Accordingly, the diameter R of the resulting front-surface electrode part 96 exceeds twice of the projected height h and becomes considerably large. When the electrodes to be inspected in the circuit board to be inspected are minute and arranged at an extremely small pitch, a clearance between electrode structures 95 adjacent to each other thus cannot be sufficiently retained. As a result, in the resulting sheet-like connector, the flexibility by virtue of the insulating sheet 91 is lost, so that it is difficult to achieve stable electrical connection to the circuit board to be inspected.

In addition, since it is difficult in practice to supply a current even in current density distribution to the overall surface of the metal layer 92 in the electroplating treatment, the growing rate of the metallic deposit varies with individual through-holes 98H in the insulating sheet 91 due to the unevenness of the current density distribution, so that a wide scatter occurs on the projected height h of the front-surface electrode parts 96 formed and the distance w from the periphery of the front-surface electrode part 96 to the periphery of the short circuit part 98, i.e., the diameter R. If a wide scatter occurs on the projected height h of the front-surface electrode parts 96, stable electrical connection to the circuit board to be inspected becomes difficult. If a wide scatter occurs on the diameter of the front-surface electrode parts 96 on the other hand, there is a possibility that adjacent front-surface electrode parts may short-circuit each other.

In the above, a means of making the projected height h of the front-surface electrode parts 96 small, and a means of making the diameter (smallest length in the case where the sectional form is not circular) r of the short circuit parts 98 small, i.e., making the diameter of the through-holes 98H in the insulating sheet 91 small are considered as means for making the diameter of the resulting front-surface electrode parts 96 small. In the sheet-like connector obtained by the former means, however, it is difficult to surely achieve stable electrical connection to the electrodes to be inspected. On the other hand, in the latter means, the formation itself of the short circuit parts 98 and front-surface electrode parts 96 by the electroplating treatment becomes difficult.

In order to solve such problems, a sheet-like connector obtained by arranging a great number of electrode structures each having a tapered front-surface electrode part, the diameter of which becomes gradually small from the base end toward the tip end, is proposed in the following Prior Art 5 and Prior Art 6.

The sheet-like connector described in the following Prior Art 5 is produced in the following manner.

As illustrated in FIG. 52(*a*), a laminate material 90B obtained by forming a resist film 93A and a front surface-side metal layer 92A on a front surface of an insulating sheet 91 in this order, and laminating a back surface-side metal layer 92B on a back surface of the insulating sheet 91 is provided. As illustrated in FIG. 52(*b*), through-holes each linked to each of the back surface-side metal layer 92B, insulating sheet 91 and resist film 93A in the laminate material 90B and extending in a thickness-wise direction of the laminate material are formed, thereby forming, in the back surface of the laminate material 90B, recesses 90K for forming electrode structures, which each have a tapered form fitted to a short circuit part and a front-surface electrode part of an electrode structure to be formed. As illustrated in FIG. 52(*c*), a plating treatment is then conducted by using the front surface-side metal layer 92A in the laminate material 90B as an electrode, thereby filling a metal into the recesses 90K for forming electrode structures to form front-surface electrode parts 96 and short circuit parts 98. The back surface-side metal layer in the laminate material is then subjected to an etching treatment to remove a part thereof, thereby forming back-surface electrode parts 97 as illustrated in FIG. 52(*d*), thus resulting in provision of the sheet-like connector.

The sheet-like connector described in the following Prior Art 6 is produced in the following manner.

As illustrated in FIG. 53(*a*), a laminate material 90C obtained by forming a front surface-side metal layer 92A on a front surface of an insulating sheet material 91A having a thickness greater than that of an insulating sheet in a sheet-like connector to be formed and laminating a back surface-side metal layer 92B on a back surface of the insulating sheet material 91A is provided. As illustrated in FIG. 53(*b*), through-holes each linked to each of the back surface-side metal layer 92B and insulating sheet material 91A in the laminate material 90C and extending in a thickness-wise direction of the laminate material are formed, thereby forming, in the back surface of the laminate material 90C, recesses 90K for forming electrode structures, which each have a tapered form fitted to a short circuit part and a front-surface electrode part of an electrode structure to be formed. A plating treatment is then conducted by using the front surface-side metal layer 92A in the laminate material 90C as an electrode, thereby filling a metal into the recesses 90K for forming electrode structures as illustrated in FIG. 53(*c*) to form front-surface electrode parts 96 and short circuit parts 98. Thereafter, the front surface-side metal layer 92A in the laminate material 90C is removed, and the insulating sheet material 91A is subjected to an etching treatment to remove the portion on the front surface side of the insulating sheet material, thereby forming an insulating sheet 91 having a necessary thickness- and exposing the front-surface electrode parts 96 as illustrated in FIG. 53(d). The back surface-side metal layer 92B is then subjected to an etching treatment, thereby forming back-surface electrode parts, thus resulting in provision of the sheet-like connector.

According to such a sheet-like connector, the front-surface electrode parts small in diameter and high in projected height can be formed in a state that a clearance between front-surface electrodes of electrode structures adjacent to each other has been sufficiently retained, since the front-surface electrode parts are in a tapered form. In addition, the front-surface electrode parts of the respective electrode structures are formed by using the recesses for forming the electrode structures formed in the laminate material as cavities, so that the electrode structures narrow in a scatter of projected height of the front-surface electrode parts can be provided.

In these sheet-like connectors, however, the diameter of the front-surface electrode parts in the electrode structures is equivalent to or smaller than the diameter of the short circuit parts, i.e., the diameter of the through-holes formed in the insulating sheet, so that the electrode structures fall off from the back surface of the insulating sheet, resulting in the difficulty of actually using such a sheet-like connector.

Prior Art 1: Japanese Patent Application Laid-Open No. 231019/1995;

Prior Art 2: Japanese Patent Application Laid-Open No. 93393/1976;

Prior Art 3: Japanese Patent Application Laid-Open No. 147772/1978;

Prior Art 4: Japanese Patent Application Laid-Open No. 250906/1986;

Prior Art 5: Japanese Patent Application Laid-Open No. 326378/1999;

Prior Art 6: Japanese Patent Application Laid-Open No. 2002-196018.

DISCLOSURE OF THE INVENTION

The present invention has been made on the basis of the foregoing circumstances and has as a first object the provision of a sheet-like connector that electrode structures each having a front-surface electrode part small in diameter can be formed, and a stable electrically connected state can be surely achieved even to a circuit device, on which electrodes have been formed at a small pitch, and the electrode structures are prevented from falling off from an insulating sheet to achieve high durability.

A second object of the present invention is to provide a process capable of producing a sheet-like connector that electrode structures each having a front-surface electrode part small in diameter and narrow in a scatter of projected height thereof can be formed, and stable electrically connected state can be surely achieved even to a circuit device, on which electrodes have been formed at a small pitch, and the electrode structures are prevented from falling off from an insulating sheet to achieve high durability.

A third object of the present invention is to provide a probe for circuit inspection, which is equipped with the above-described sheet-like connector.

A fourth object of the present invention is to provide an inspection apparatus for circuit devices, which is equipped with the above-described probe for circuit inspection.

According to the present invention, there is provided a sheet-like connector comprising an insulating sheet and a plurality of electrode structures arranged in the insulating sheet in a state separated from one another in a plane direction of the insulating sheet and extending through in a thickness-wise direction of the insulating sheet, wherein each of the electrode structures is composed of a front-surface electrode part exposed to a front surface of the insulating sheet and projected from the front surface of the insulating sheet, a back-surface electrode part exposed to a back surface of the insulating sheet, a short circuit part continuously extending from the base end of the front-surface electrode part through the insulating sheet in the thickness-wise direction thereof and linked to the back-surface electrode part, and a holding part continuously extending from a base end portion of the front-surface electrode part outward along the front surface of the insulating sheet.

In the sheet-like connector according to the present invention, the front-surface electrode part in the electrode structure may preferably have a shape that the diameter becomes gradually small from the base end thereof toward the tip end.

The value of a ratio $R_2/R_1$ of the diameter $R_2$ of the tip end of the front-surface electrode part in the electrode structure to the diameter $R_1$ of the base end of the front-surface electrode part may preferably be 0.11 to 0.55.

The value of a ratio $h/R_1$ of the projected height h of the front-surface electrode part in the electrode structure to the diameter $R_1$ of the base end of the front-surface electrode part may preferably be 0.2 to 3.

The short circuit part in the electrode structure may have a shape that the diameter becomes gradually small from the back surface of the insulating sheet toward the front surface thereof.

The insulating sheet may be composed of preferably an etching-capable polymeric material, particularly preferably polyimide.

According to the present invention, there is provided a process for producing the sheet-like connector described above, which comprises the steps of:

providing a laminate material having at least an insulating sheet, a first front surface-side metal layer formed on a front surface of the insulating sheet, an insulating layer formed on the surface of the first front surface-side metal layer and a second front surface-side metal layer formed on the surface of the insulating layer, forming through-holes linked to each of the insulating sheet, first front surface-side metal layer and insulating layer in the laminate material and extending in a thickness-wise direction of the laminate material, thereby forming, in the back surface of the laminate material, recesses for forming electrode structures, subjecting the laminate material to a plating treatment by using the second front surface-side metal layer as an electrode, thereby filling a metal into the recesses for forming electrode structures to form front-surface electrode parts projected from the front surface of the insulating sheet and short circuit parts continuously extending from the respective base ends of the front-surface electrode parts through the insulating sheet in a thickness-wise direction thereof, removing the second front surface-side metal layer and insulating layer from the laminate material, thereby exposing the front-surface electrode parts and the first front surface-side metal layer, and then subjecting the first front surface-side metal layer to an etching treatment, thereby forming holding parts continuously extending from a base end portion of the front-surface electrode part outward along the front surface of the insulating sheet.

In the production process of the sheet-like connector according to the present invention, the through-hole in the insulating layer in the recesses for forming the electrode structures may preferably be formed in a form that the diameter becomes gradually small from the back surface of the insulating layer toward the front surface thereof.

In such a production process of the sheet-like connector, it may be preferable that a laminate material that the insulating layer thereof is formed of an etching-capable polymeric material be used as the laminate material, and the through-hole in the insulating layer in the recesses for forming the electrode structures be formed by etching.

In the production process of the sheet-like connector according to the present invention, the through-hole in the insulating sheet in the recesses for forming the electrode structures may preferably be formed in a form that the diameter becomes gradually small from the back surface of the insulating sheet toward the front surface thereof.

In such a production process of the sheet-like connector, it may be preferable that a laminate material that the insulating sheet thereof is formed of an etching-capable polymeric material be used as the laminate material, and the through-hole in the insulating sheet in the recesses for forming the electrode structures be formed by etching.

According to the present invention, there is provided a process for producing the sheet-like connector described above, which comprises the steps of:

providing a laminate material having at least an insulating sheet, a front surface-side metal layer formed on a front surface of the insulating sheet, an insulating layer formed on the surface of the front surface-side metal layer and a back surface-side metal layer formed on a back surface of the insulating sheet, forming through-holes linked to each of the insulating layer, front surface-side metal layer and insulating sheet in the laminate material and extending in a thickness-wise direction of the laminate material, thereby forming, in the front surface of the laminate material, recesses for forming electrode structures, subjecting the laminate material to a plating treatment by using the back surface-side metal layer as an electrode, thereby filling a metal into the recesses for forming electrode structures to form front-surface electrode parts projected from the front surface of the insulating sheet and short circuit parts continuously extending from the respective base ends of the front-surface electrode parts through the insulating sheet in a thickness-wise direction thereof, removing the insulating layer from the laminate material, thereby exposing the front-surface electrode parts and the front surface-side metal layer, and then subjecting the front surface-side metal layer to an etching treatment, thereby forming holding parts continuously extending from a base end portion of the front-surface electrode part outward along the front surface of the insulating sheet.

According to the present invention, there is provided a probe for circuit inspection for conducting electrical connection between a circuit device that is an object of inspection and a tester, which comprises:

a circuit board for inspection, on which a plurality of inspection electrodes have been formed according to electrodes to be inspected of a circuit device, which is an object of inspection, an anisotropically conductive connector arranged on the circuit board for inspection, and the above-described sheet-like connector arranged on the anisotropically conductive connector.

In the probe for circuit inspection according to the present invention, it may be preferable that when the circuit device that is the object of inspection is a wafer, on which a great number of integrated circuits have been formed, and the anisotropically conductive connector should have a frame plate having a plurality of openings formed correspondingly to electrode regions, in which electrodes to be inspected in the whole or part of the integrated circuits formed on the wafer, which is the object of inspection, have been arranged, and anisotropically conductive sheets arranged so as to close the respective openings in the frame plate.

According to the present invention, there is provided an inspection apparatus for circuit devices, which comprises the above-described probe for circuit inspection.

EFFECTS OF THE INVENTION

According to the sheet-like connector of the present invention, the holding part continuously extending from a base end portion of the front-surface electrode part outward along the front surface of the insulating sheet is formed in each of the electrode structures, so that the electrode structures are prevented from falling off from the insulating sheet to achieve high durability even when the diameter of the front-surface electrode parts is small.

In addition, the front-surface electrode parts small in diameter can be formed, whereby a clearance between adjacent front-surface electrodes can be surely retained, and so flexibility by virtue of the insulating sheet can be sufficiently exhibited. As a result, a stable electrically connected state can be surely achieved even to a circuit device, on which electrodes have been formed at a small pitch.

According to the production process of the sheet-like connector according to the present invention, the recesses for forming the electrode structures are formed in the laminate material having the insulating sheet in advance, and the front-surface electrode parts are formed by using the recesses for forming the electrode structures as cavities, so that the front-surface electrode parts small in diameter and narrow in a scatter of the projected height can be provided.

In addition, the holding parts continuously extending from the base end portion of the front-surface electrode part outward along the front surface of the insulating sheet can be surely formed by subjecting the front surface-side metal layer formed on the front surface of the insulating sheet to an etching treatment, so that a sheet-like connector has a high durability as the electrode structures are prevented from falling off from the insulating sheet can be produced even when the diameter of the front-surface electrode parts is small.

According to the probe for circuit inspection according to the present invention, the above-described sheet-like connector is provided, so that a stable electrically connected state can be surely achieved even to a circuit device, on which electrodes have been formed at a small pitch. In addition, since the electrode structures in the sheet-like connector are prevented from falling off, high durability is achieved.

According to the inspection apparatus for circuit devices, the above-described probe for circuit inspection is provided, so that a stable electrically connected state can be surely achieved even to a circuit device, on which electrodes have been formed at a small pitch. In addition, inspection can be performed with high reliability over a long period of time even when the inspection is conducted as to a great number of circuit devices.

[Description of Characters]

| | |
|---|---|
| 1 | Probe for circuit inspection, |
| 3 | Pressurizing plate, |
| 4 | Wafer-mounting table, |
| 5 | Heater, |
| 6 | Wafer, |
| 7 | Electrodes to be inspected, |
| 10 | Sheet-like connector, |
| 10A, 10B | Laminate materials, |
| 10K | Recesses for forming electrode structures, |
| 11 | Insulating sheet, |
| 11H | Through-holes, |
| 12A, 12B, 12C, 12D, 12E | Resist films, |
| 13, 13A, 13B, 13C, 13D | Resist films, |
| 13K | Patterned holes, |
| 14A, 14B, 14C | Resist films, |
| 14K | Patterned holes, |
| 15 | Electrode structures, |
| 16 | Front-surface electrode parts, |

-continued

[Description of Characters]

| | |
|---|---|
| 16B | Insulating layer, |
| 16A | Second front surface-side metal layer, |
| 16H | Through-holes, |
| 16M | Conductors for front-surface electrode parts, |
| 17 | Back-surface electrode parts, |
| 17A | Back surface-side metal layer, |
| 17H | Through-holes, |
| 18 | Short circuit parts, |
| 19 | Holding parts, |
| 19A | First front surface-side metal layer, |
| 19B | Front surface-side metal layer, |
| 19H | Through-holes, |
| 20 | Circuit board for inspection, |
| 21 | Inspection electrodes, |
| 30 | Anisotropically conductive connector, |
| 31 | Frame plate, |
| 32 | Openings, |
| 33 | Air inflow holes, |
| 35 | Anisotropically conductive sheet, |
| 36 | Conductive parts, |
| 37 | Insulating parts, |
| 38 | Projected portions, |
| 80 | Anisotropically conductive sheet, |
| 85 | Circuit board for inspection, |
| 86 | Inspection electrodes, |
| 90 | Sheet-like connector, |
| 90A, 90B, 90C | Laminate materials, |
| 90K | Recesses for forming electrode structures, |
| 91 | Insulating sheet, |
| 91A | Insulating sheet material, |
| 92, 92A, 92B | Metal Layers, |
| 93, 93A | Resist films, |
| 94A, 94B | Resist films, |
| 95 | Electrode structures, |
| 96 | Front-surface electrode parts, |
| 97 | Back-surface electrode parts, |
| 98 | Short circuit parts, |
| 98H | Through-holes, |
| L | Integrated circuits, |
| P | Conductive particles. |

BEST MODE FOR CARRYING OUT THE INVENTION

The embodiments of the present invention will hereinafter be described in details.

[Sheet-Like Connector]

Figure 1:
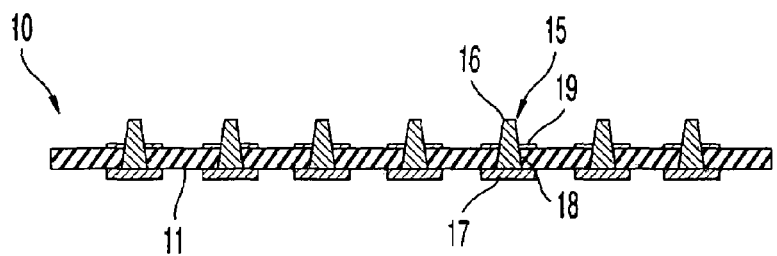
FIG. 1 is a cross-sectional view illustrating the construction of a first exemplary sheet-like connector according to the present invention.
Figure 2:
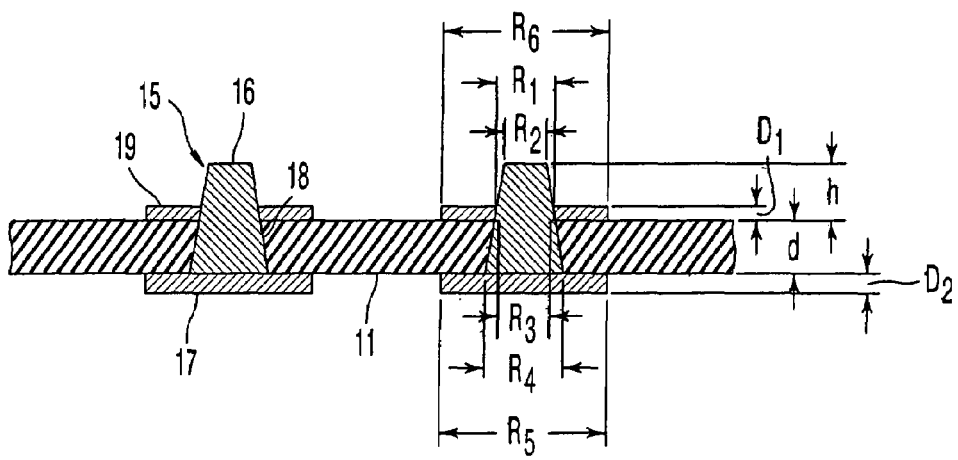
FIG. 2 is a cross-sectional view illustrating, on an enlarged scale, electrode structures of the first exemplary sheet-like connector.

FIG. 1 is a cross-sectional view illustrating the construction of a first exemplary sheet-like connector according to the present invention, and FIG. 2 is a cross-sectional view illustrating, on an enlarged scale, electrode structures in the first exemplary sheet-like connector.

The first exemplary sheet-like connector 10 is used in a probe for conducting electrical inspection of circuit devices and has a flexible insulating sheet 11. In the insulating sheet 11, a plurality of electrode structures 15 composed of a metal and extending in a thickness-wise direction of the insulating sheet 11 are arranged in a state separated from one another in a plane direction of the insulating sheet 11 in accordance with a pattern corresponding to a pattern of electrodes to be inspected of a circuit device that is an object of inspection.

Each of the electrode structures 15 is composed of a protruding front-surface electrode part 16 exposed to a front surface of the insulating sheet 11 and projected from the front surface of the insulating sheet 11, a rectangular flat plate-like back-surface electrode part 17 exposed to a back surface of the insulating sheet 11, a short circuit part 18 continuously extending from the base end of the front-surface electrode part 16 through the insulating sheet 11 in the thickness-wise direction thereof and linked to the back-surface electrode part 17, and a circular ring plate-like holding part 19 continuously extending from a peripheral surface of a base end portion of the front-surface electrode part 16 outward and radially along the front surface of the insulating sheet 11. In the electrode structure 15 of this embodiment, each front-surface electrode part 16 is formed continuously with the short circuit part 18 in a tapered form that the diameter becomes gradually small as it goes toward a tip end from a base end thereof, i.e., formed in a truncated cone form as a whole, and the short circuit part 18 continuous with the base end of the front-surface electrode part 16 is formed in a tapered form that the diameter becomes gradually small as it goes toward one surface from the other surface of the insulating sheet 11, i.e., formed in a truncated cone form as a whole. The diameter $R_1$ of the base end of the front-surface electrode part 16 is the same as the diameter $R_3$ of an end of the short circuit part 18 continuous with this base end.

No particular limitation is imposed on the insulating sheet 11 so far as it has insulating property and is flexible. For example, a resin sheet formed of a polyamide resin, liquid crystal polymer, polyester, fluororesin or the like, or a sheet obtained by impregnating a cloth woven by fibers with any of the above-described resins may be used. However, the insulating sheet is preferably composed of an etching-capable material in that through-holes for forming the short circuit parts 18 can be easily formed by etching with polyimide being particularly preferred.

No particular limitation is also imposed on the thickness d of the insulating sheet 11 so far as such an insulating sheet 11 is flexible. However, it is preferably 10 to 50 μm, more preferably 10 to 25 μm.

As a metal for forming the electrode structures 15, may be used nickel, copper, gold, silver, palladium, iron or the like. The electrode structures 15 may be any of those formed of a simple metal, those formed of an alloy of at least two metals and those obtained by laminating at least two metals as a whole.

On the surfaces of the front-surface electrode part 16 and back-surface electrode part 17 in the electrode structure 15, a film of a chemically stable metal having high conductivity, such as gold, silver or palladium may be formed in order that oxidation of the electrode parts may be prevented, and electrode parts small in contact resistance may be provided.

In each electrode structure 15, a ratio ($R_2/R_1$) of the diameter $R_2$ of the tip end of the front-surface electrode part 16 to the diameter $R_1$ of the base end is preferably 0.11 to 0.55, more preferably 0.15 to 0.4. By satisfying such conditions, a stable electrically connected state to a circuit device to be connected is surely achieved even when the circuit device has minute electrodes at a small pitch.

The diameter $R_1$ of the base end of the front-surface electrode part 16 is preferably 30 to 70%, more preferably 35 to 60% of the pitch of the electrode structures 15.

A ratio $h/R_1$ of the projected height h of the front-surface electrode part 16 to the diameter $R_1$ of the base end thereof is preferably 0.2 to 0.8, more preferably 0.25 to 0.6. By satisfying such conditions, electrode structures 15 of a pattern corresponding to a pattern of electrodes of a circuit device to be connected can be easily formed even when the circuit device has minute electrodes at a small pitch, and moreover a stable electrically connected state to the circuit device is more surely achieved.

The diameter $R_1$ of the base end of the front-surface electrode part 16 is preset in consideration of the above-described conditions, the diameter of its corresponding electrode to be connected, and the like. However, it is, for example, preferably 30 to 80 μm, more preferably 30 to 50 μm.

The projected height h of the front-surface part 16 is preferably 15 to 50 μm, more preferably 15 to 30 μm in that stable electrical connection to its corresponding electrode to be connected can be achieved.

The outer diameter $R_5$ of each back-surface electrode part 17 is only required to be greater than the diameter $R_4$ of the other end of the short circuit part 18 linked to the back-surface electrode part 17 and smaller than the pitch of the electrode structures 15 and is preferably great as much as possible. Stable electrical connection can be thereby achieved with certainty even to, for example, the anisotropically conductive sheet.

The thickness $D_2$ of the back-surface electrode part 17 is preferably 10 to 40 μm, more preferably 15 to 35 μm in that sufficiently high strength and excellent repetitive durability are achieved.

A ratio $R_3/R_4$ of the diameter $R_3$ of one end of the short circuit part 18 to the diameter $R_4$ of the other end thereof is preferably 0.45 to 1, more preferably 0.7 to 0.9.

The diameter $R_3$ of one end of the short circuit part 18 is preferably 30 to 70%, more preferably 35 to 60% of the pitch of the electrode structures 15.

The diameter $R_6$ of each holding part 19 is preferably 30 to 70%, more preferably 40 to 60% of the pitch of the electrode structures 15.

The thickness $D_1$ of the holding part 19 is preferably 3 to 12 μm, more preferably 5 to 9 μm.

According to such a sheet-like connector 10, the holding part 19 continuously extending from the base end portion of the front-surface electrode part 16 outward along the front surface of the insulating sheet 11 is formed in each of the electrode structures 15, so that the electrode structures 15 are prevented from falling off from the back surface of the insulating sheet 11 to achieve high durability even when the diameter of the front-surface electrode parts 16 is small.

In addition, the electrode structures each have the front-surface electrode part 16 small in diameter, whereby a clearance between adjacent front-surface electrodes 16 can be surely retained, and so flexibility by virtue of the insulating sheet 11 can be sufficiently exhibited. As a result, a stable electrically connected state can be surely achieved even to a circuit device, on which electrodes have been formed at a small pitch.

The above-described first exemplary sheet-like connector 10 can be produced, for example, in the following manner.

Figure 3:
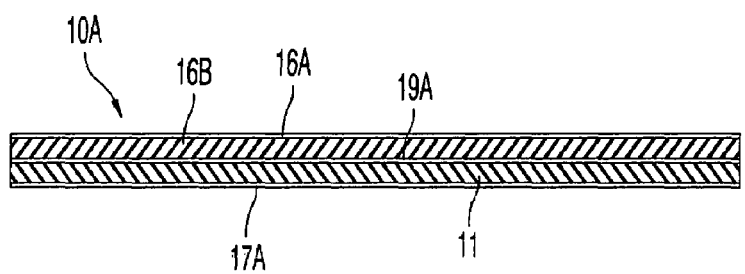
FIG. 3 is a cross-sectional view illustrating the construction of a laminate material for producing the first exemplary sheet-like connector.

As illustrated in FIG. 3, a laminate material 10A composed of an insulating sheet 11, a first front surface-side metal layer 19A formed on a front surface of the insulating sheet 11, an insulating layer 16B formed on the surface of the first front surface-side metal layer 19A, a second front surface-side metal layer 16A formed on the surface of the insulating layer 16B, and a back surface-side metal layer 17A formed on a back surface of the insulating sheet 11 is first provided.

In the laminate material 10A, the first front surface-side metal layer 19A is formed so as to have a thickness equivalent to the thickness of a holding part 19 in each of electrode structures 15 to be formed, the insulating layer 16B is formed in such a manner that the total thickness of a thickness of the insulating layer 16B and the thickness of the first front surface-side metal layer 19A is equivalent to the projected height of a front-surface electrode part 16 in the electrode structure 15 to be formed, and the back surface-side metal layer 17A is formed so as to have a thickness smaller than the thickness of a back-surface electrode part 17 in the electrode structure 15 to be formed.

As a material for forming the insulating sheet 11, a polymeric material capable of being etched is preferably used, with polyimide being more preferred.

As a material for forming the insulating layer 16B, a polymeric material capable of being etched is preferably used, with polyimide being more preferred.

Such a laminate material 10A can be obtained by providing a laminated polyimide sheet with metal layers composed of, for example, copper laminated on both sides thereof and a laminated thermoplastic polyimide sheet with a metal layer composed of, for example, copper laminated on one side thereof, which are both generally marketed, arranging them in such a manner that a surface of the laminated thermoplastic polyimide sheet, on which metal layer is not laminated, faces the surface of one metal layer of the laminated polyimide sheet, and subjecting both sheets to a pressure-bonding treatment under heat.

Figure 4:
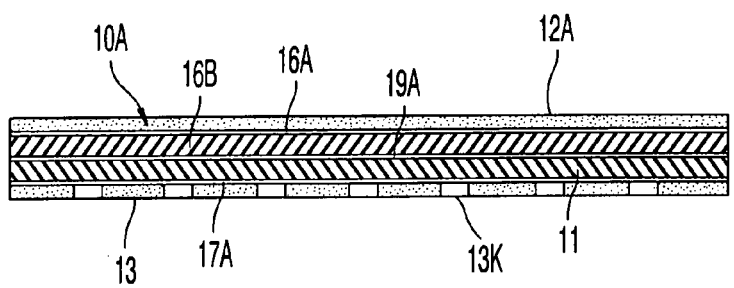
FIG. 4 is a cross-sectional view illustrating a state that resist films for etching have been formed on both surfaces of the laminate material shown in FIG. 3.

To such a laminate material 10A, as illustrated in FIG. 4, a resist film 12A for etching is formed on the whole surface of the second front surface-side metal layer 16A, and a resist film 13 for etching, in which a plurality of patterned holes 13K have been formed in accordance with a pattern corresponding to a pattern of the electrode structures 15 to be formed, is formed on the surface of the back surface-side metal layer 17A.

As materials for forming the resist films 12A and 13, may be used various materials used as photoresists for etching.

Figure 5:
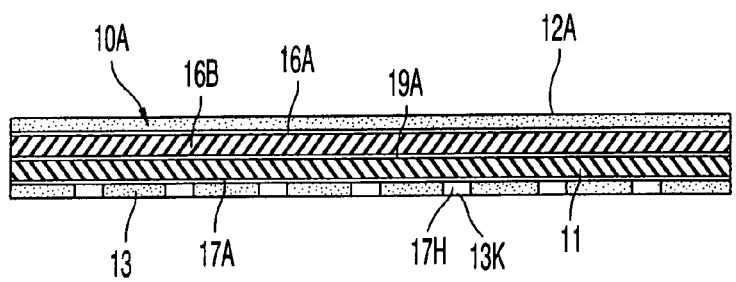
FIG. 5 is a cross-sectional view illustrating a state that through-holes have been formed in a back surface-side metal layer in the laminate material.
Figure 6:
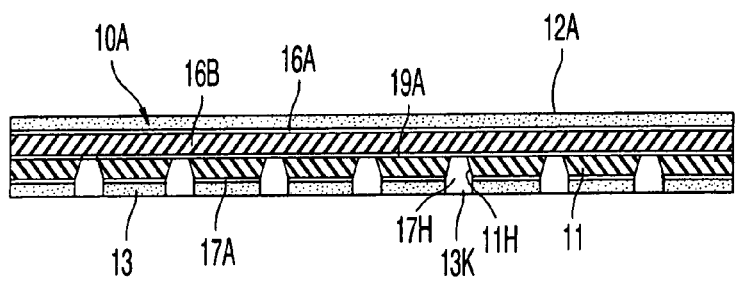
FIG. 6 is a cross-sectional view illustrating a state that through-holes have been formed in an insulating sheet in the laminate material.
Figure 7:
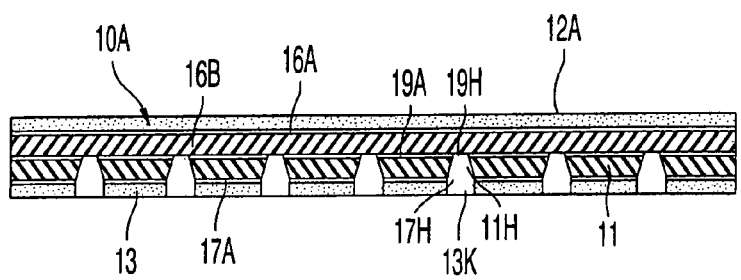
FIG. 7 is a cross-sectional view illustrating a state that through-holes have been formed in a first front surface-side metal layer in the laminate material.
Figure 8:
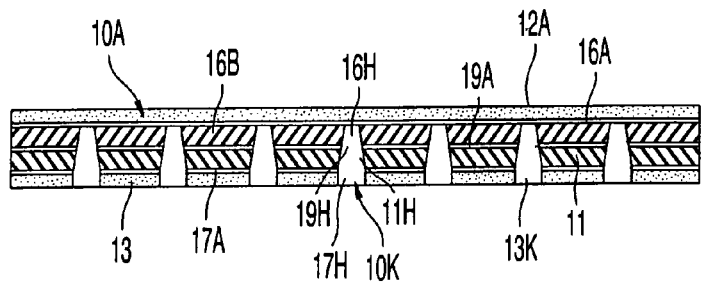
FIG. 8 is a cross-sectional view illustrating a state that through-holes have been formed in an insulating layer in the laminate material to form recesses for forming electrode structures.

Exposed portions of the back surface-side metal layer 17A are then subjected to an etching treatment through the respective patterned holes 13K in the resist film 13 to remove such portions, thereby forming, in the back surface-side metal layer 17A, a plurality of through-holes 17H linked to the respective patterned holes 13K in the resist film 13 as illustrated in FIG. 5. Thereafter, exposed portions of the insulating sheet 11 are subjected to an etching treatment through the respective patterned holes 13K in the resist film 13 and the respective through-holes 17H in the back surface-side metal layer 17A to remove such portions, thereby forming, in the insulating sheet 11, a plurality of tapered through-holes 11H, the diameter of which becomes gradually small from the back surface of the insulating sheet 11 toward the front surface thereof, and each of which are linked to the through-holes 17K in the back surface-side metal layer 17A as illustrated in FIG. 6. Thereafter, exposed portions of the first front surface-side metal layer 19A are subjected to an etching treatment through the respective patterned holes 13K in the resist film 13, the respective through-holes 17H in the back surface-side metal layer 17A and the respective through-holes 11H in the insulating sheet 11 to remove such portions, thereby forming, in the first front surface-side metal layer 19A, a plurality of through-holes 19H each linked to the through-holes 11H in the insulating sheet 11 as illustrated in FIG. 7. Further, exposed portions of the insulating layer 16B are subjected to an etching treatment through the respective patterned holes 13K in the resist film 13, the respective through-holes 17H in the back surface-side metal layer 17A, the respective through-holes 11H in the insulating sheet 11 and the respective through-holes 19H in the first front surface-side metal layer 19A to remove such portions, thereby forming, in the insulating layer 16B, a plurality of tapered through-holes 16H, the diameter of which becomes gradually small from the back surface of the insulating layer 16B toward the front surface thereof, and each of which are linked to the respective through-holes 19H in the first front surface-side metal layer 19A as illustrated in FIG. 8. A plurality of recesses 10K for forming electrode structures each linked with the respective through-holes 17H in the back surface-side metal layer 17A, the respective through-holes 11H in the insulating sheet 11, the respective through-holes 19H in the first front surface-side metal layer 19A and the respective through-holes 16H in the insulating layer 16B linked to one another are thereby formed in the back surface of the laminate material 10A.

Etchants for etching the back surface-side metal layer 17A and the first front surface-side metal layer in the above-described process are suitably selected according to the materials forming these metal layers. When these metal layers are composed of, for example, copper, an aqueous solution of ferric chloride may be used.

As an etchant for etching the insulating sheet 11 and the insulating layer 16B, may be used an aqueous hydrazine solution. The tapered through-holes 11H and 16H, the diameter of which becomes gradually small from the back surface toward the front surface, can be formed in the insulating sheet 11 and the insulating layer 16B, respectively, by selecting conditions for the etching treatments.

Figure 9:
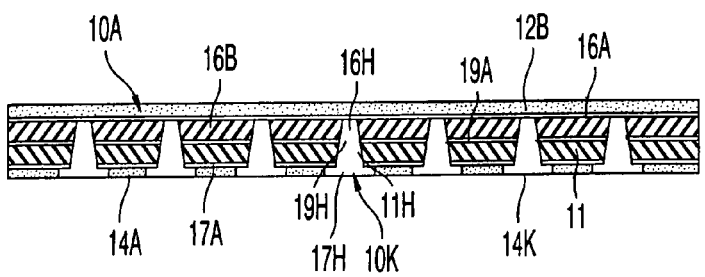
FIG. 9 is a cross-sectional view illustrating a state that resist films for plating have been formed on both surfaces of the laminate material, in which the recesses for forming electrode structures were formed.

After the resist films 12A and 13 are removed from the laminate material 10A, in which the recesses 10K for forming electrode structures have been formed in such a manner, as illustrated in FIG. 9, a resist film 12B for plating is formed on the laminate material 10A so as to cover the whole surface of the second front surface-side metal layer 16A, and a resist film 14A for plating, in which a plurality of patterned holes 14K have been formed in accordance with a pattern corresponding to a pattern of back-surface electrode parts 17 in the electrode structures 15 to be formed, is formed on the surface of the back surface-side metal layer 17A.

As materials for forming the resist films 12B and 14A, may be used various materials used as photoresists for plating.

Figure 10:
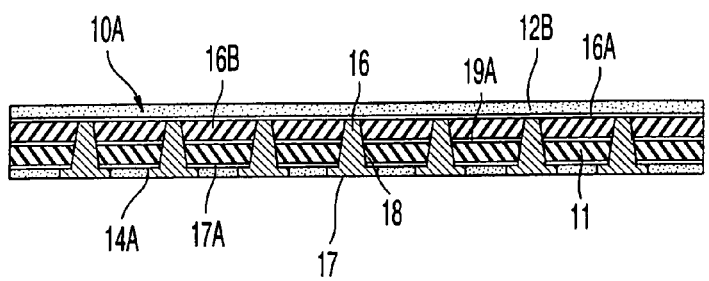
FIG. 10 is a cross-sectional view illustrating a state that a metal has been filled into the recesses for forming electrode structures to form front-surface electrode parts and short circuit parts.

The laminate material 10A is then subjected to an electroplating treatment by using the second front surface-side metal layer 16A as an electrode to fill a metal into the respective recesses 10K for forming electrode structures and the respective patterned holes 14K in the resist film 14A, thereby forming a plurality of protruding front-surface electrode parts 16 projected from the front surface of the insulating sheet 11, short circuit parts 18 continuously extending from the respective base ends of the front-surface electrode parts 16 through the insulating sheet 11 in a thickness-wise direction thereof, and back-surface electrode parts 17 respectively linked to the other ends of the short circuit parts 18 as illustrated in FIG. 10. In this state, the back-surface electrode parts 17 are in a state connected to one another through the back surface-side metal layer 17A.

Figure 12:
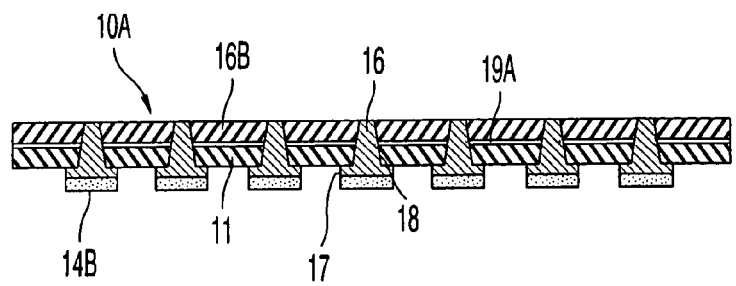
FIG. 12 is a cross-sectional view illustrating a state that portions of the back surface-side metal layer have been removed to form a plurality of the back-surface electrode parts separated from one another.

After the resist films 12B and 14A are removed from the laminate material 10A, in which the front-surface electrode parts 16, short circuit parts 18 and back-surface electrode parts 17 have been formed in such a manner, a patterned resist film 14B for etching is formed so as to cover the back-surface electrode parts 17 to subject the second front surface-side metal layer 16A and the back surface-side metal layer 17A to an etching treatment, thereby removing the whole of the second front surface-side metal layer 16A and exposed portions of the back surface-side metal layer as illustrated in FIG. 12 to form a plurality of back-surface electrode parts 17 separated from one another.

Figure 13:
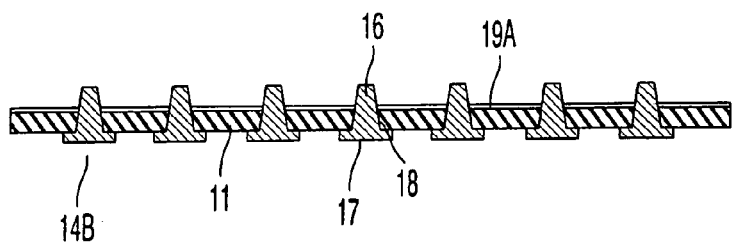
FIG. 13 is a cross-sectional view illustrating a state that the insulting layer has been removed from the laminate material.
Figure 14:
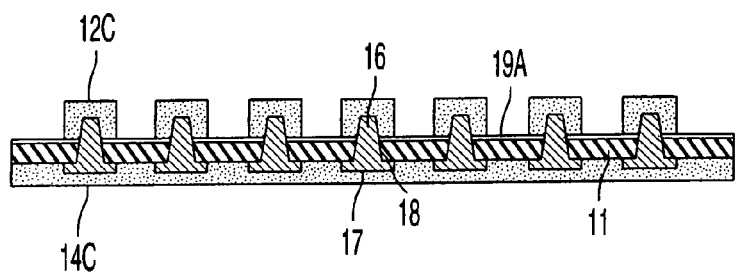
FIG. 14 is a cross-sectional view illustrating a state that resist films for etching have been formed on the surfaces of the first front surface-side metal layer and front-surface electrode parts.

The insulating layer 16B is then subjected to an etching treatment to remove the whole thereof, and the resist film 14B is removed, thereby exposing the front-surface electrode parts 16, first front surface-side metal layer 19A and back-surface electrode parts 17 as illustrated in FIG. 13. Thereafter, as illustrated in FIG. 14, a patterned resist film 12C for etching is formed so as to cover the front-surface electrode parts 16 and portions to become holding parts 19 in the first front surface-side metal layers 19A, and a resist film 14C for etching is formed so as to cover the back surface of the insulating sheet 11 and all of the back-surface electrode parts 17. The first front surface-side metal layer 19A is then subjected to an etching treatment to remove exposed portions, thereby forming holding parts 19 each continuously extending from a peripheral surface of a base end portion of the front-surface electrode part 16 outward and radially along the front surface of the insulating sheet 11, thus resulting in the formation of the electrode structures 15.

The resist films 12C is then removed from the front-surface electrode parts 16 and holding parts 19, and the resist film 14C is removed from the back surface of the insulating sheet 11 and the back-surface electrode parts 17, thereby obtaining the sheet-like connector 10 shown in FIG. 1.

According to such a process, the recesses 10K for forming the electrode structures are formed in the laminate material 10A having the insulating sheet 11 in advance, and the front-surface electrode parts 16 are formed by using the recesses 10K for forming the electrode structures as cavities, so that the front-surface electrode parts 16 small in diameter and narrow in a scatter of the projected height thereof can be provided.

In addition, the holding parts 19 each continuously extending from the base end portion of the front-surface electrode part 16 outward along the front surface of the insulating sheet 11 can be surely formed by subjecting the front surface-side metal layer 19A formed on the front surface of the insulating sheet 11 to an etching treatment, so that the sheet-like connector 10 that has high durability as the electrode structures 15 are prevented from falling off from the insulating sheet 11 can be produced even when the diameter of the front-surface electrode parts 16 is small.

Figure 16:
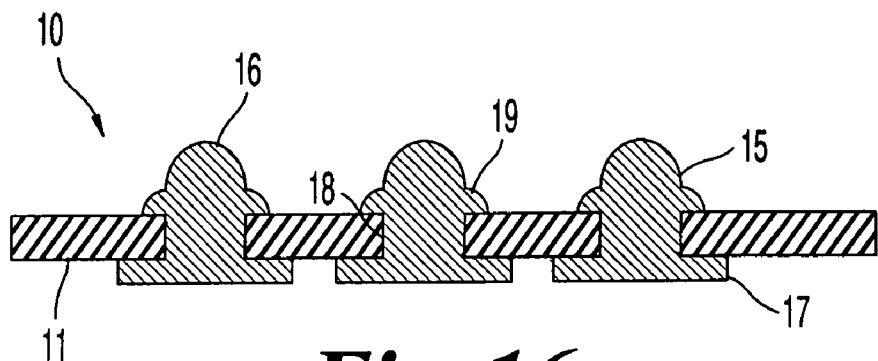
FIG. 16 is a cross-sectional view illustrating the construction of a second exemplary sheet-like connector according to the present invention.

FIG. 16 is a cross-sectional view illustrating the construction of a second exemplary sheet-like connector according to the present invention.

The second exemplary sheet-like connector 10 is used in a probe for conducting electrical inspection of circuit devices and has a flexible insulating sheet 11. In the insulating sheet 11, a plurality of electrode structures 15 composed of a metal and extending in a thickness-wise direction of the insulating sheet 11 are arranged in a state separated from one another in a plane direction of the insulating sheet 11 in accordance with a pattern corresponding to a pattern of electrodes to be inspected of a circuit device that is an object of inspection.

Each of the electrode structures 15 is composed of a protruding front-surface electrode part 16 exposed to a front surface of the insulating sheet 11 and projected from the front surface of the insulating sheet 11, a rectangular flat plate-like back-surface electrode part 17 exposed to a back surface of the insulating sheet 11, a columnar short circuit part 18 continuously extending from the base end of the front-surface electrode part 16 through the insulating sheet 11 in the thickness-wise direction thereof and linked to the back-surface electrode part 17, and a circular ring plate-like holding part 19 continuously extending from a peripheral surface of a base end portion of the front-surface electrode part 16 outward and radially along the front surface of the insulating sheet 11. In the electrode structure 15 of this embodiment, the top portion of each front-surface electrode part 16 is formed in an almost semi-spherical shape that the diameter becomes small as it goes toward the tip thereof, and the diameter of the base end of the front-surface electrode part 16 is equivalent to the diameter of one end of the short circuit part 18 continuous with the base end.

The above-described second exemplary sheet-like connector 10 can be produced, for example, in the following manner.

Figure 17:
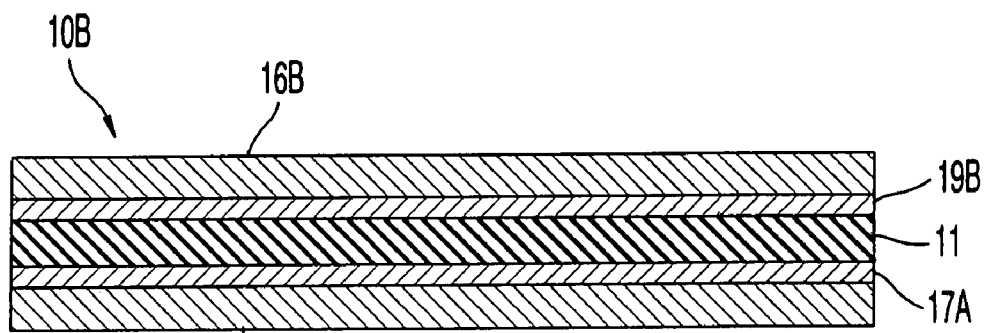
FIG. 17 is a cross-sectional view illustrating the construction of a laminate material for producing the second exemplary sheet-like connector.

As illustrated in FIG. 17, a laminate material 10B composed of an insulating sheet 11 formed of a polymeric material capable being etched, for example, polyimide, a front surface-side metal layer 19B formed on a front surface of the insulating sheet 11, an insulating layer 16B formed on the surface of the front surface-side metal layer 19B, a back surface-side metal layer 17A formed on a back surface of the insulating sheet 11, and a resist film 13A formed on the back surface-side metal layer 17A is first provided.

In the laminate material 10B, the front surface-side metal layer 19B is formed so as to have a thickness equivalent to the thickness of a holding part 19 in each of electrode structures 15 to be formed, the insulating layer 16B is formed in such a manner that the total thickness of a thickness of the insulating layer 16B and the thickness of the first front surface-side metal layer 19B is equivalent to the projected height of a front-surface electrode part 16 in the electrode structure 15 to be formed, and the back surface-side metal layer 17A is formed so as to have a thickness equivalent to the thickness of a back-surface electrode part 17 in the electrode structure 15 to be formed.

Figure 18:
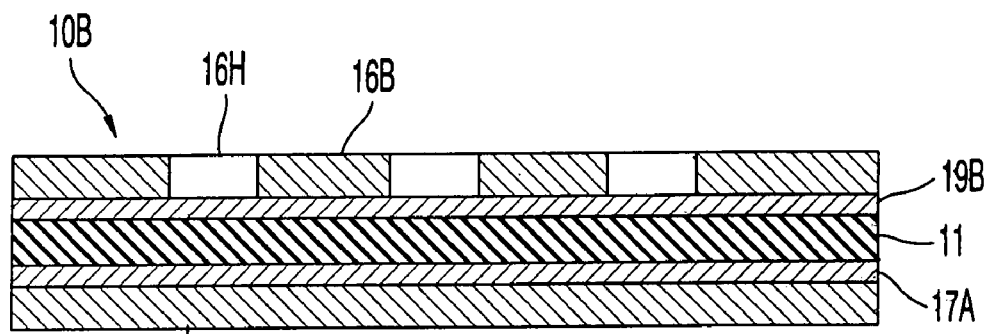
FIG. 18 is a cross-sectional view illustrating a state that through-holes have been formed in an insulating layer in the laminate material shown in FIG. 17.
Figure 19:
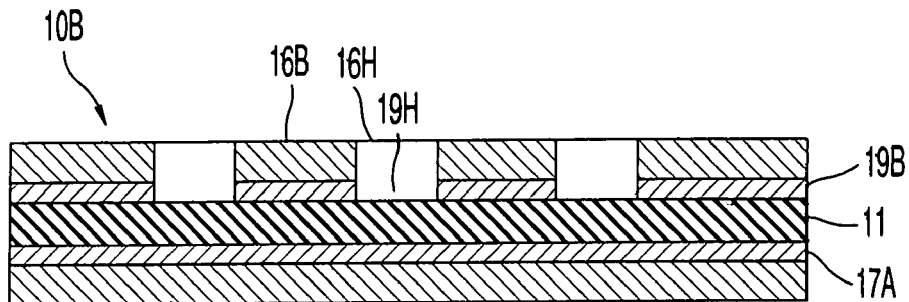
FIG. 19 is a cross-sectional view illustrating a state that through-holes have been formed in a front surface-side metal layer in the laminate material.
Figure 20:
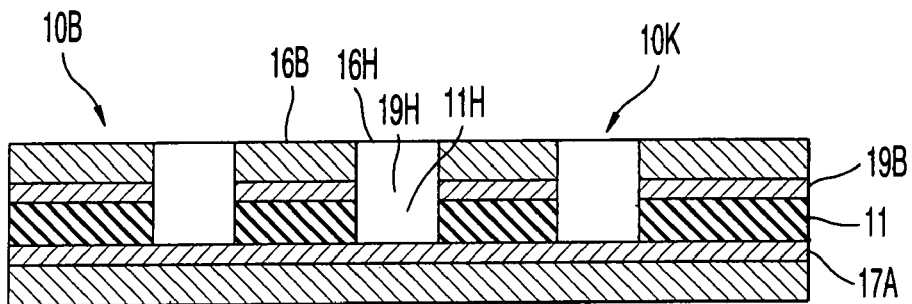
FIG. 20 is a cross-sectional view illustrating a state that through-holes have been formed in an insulating sheet in the laminate material to form recesses for forming electrode structures.

The insulating layer 16B is then subjected to photolithography (exposing treatment and developing treatment), thereby forming a plurality of through-holes 16H in the insulating layer 16B in accordance with a pattern corresponding to a pattern of front-surface electrode parts 16 in the electrode structures 15 to be formed as illustrated in FIG. 18. Exposed portions of the front surface-side metal layer 19B are then subjected to an etching treatment through the respective through-holes 16H in the insulating layer 16B to remove such portions, thereby forming, in the front surface-side metal layer 19B, a plurality of through-holes 19H each linked to the respective through-holes 16H in the insulating layer 16B as illustrated in FIG. 19. Exposed portions of the insulating sheet 11 are then subjected to an etching treatment through the respective through-holes 16H in the insulating layer 16B and the respective through-holes 19H in the front surface-side metal layer 19B to remove such portions, thereby forming, in the insulating sheet 11, a plurality of through-holes 11H each linked to the respective through-holes 19H in the front surface-side metal layer 19B as illustrated in FIG. 20. A plurality of recesses 10K for forming electrode structures with the respective through-holes 16H in the insulating layer 16B, the respective through-holes 19H in the front surface-side metal layer 19B and the respective through-holes 11H in the insulating sheet 11 linked to one another are thereby formed in the front surface of the laminate material 10B.

Figure 21:
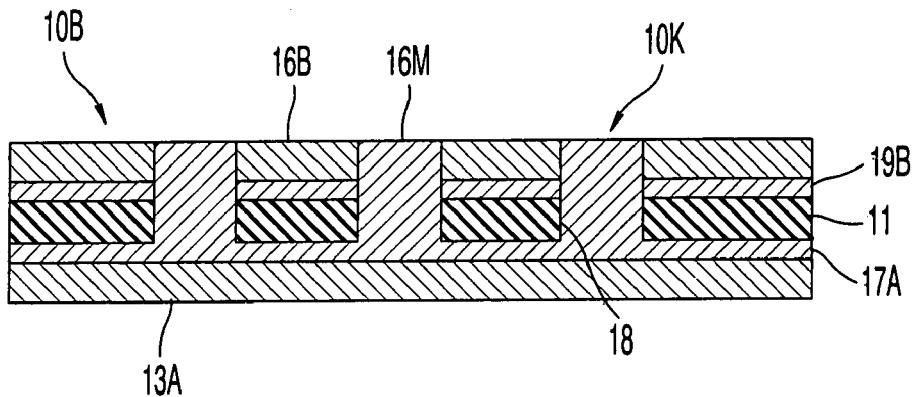
FIG. 21 is a cross-sectional view illustrating a state that a metal has been filled into the recesses for forming electrode structures to form conductors for front-surface electrode parts, and short circuit parts.

The laminate material 10B, in which the recesses 10K for forming electrode structures have been formed in such a manner, is subjected to an electroplating treatment by using the back surface-side metal layer 17A as an electrode to fill a metal into the respective recesses 10K for forming electrode structures, thereby forming a plurality of columnar conductors 16M for front-surface electrode parts, which are projected from the front surface of the insulating sheet 11, and short circuit parts 18 continuously extending from the respective base ends of the conductors 16M for front-surface electrode parts through the insulating sheet 11 in a thickness-wise direction thereof and linked to the back surface-side metal layer 17A as illustrated in FIG. 21.

Figure 22:
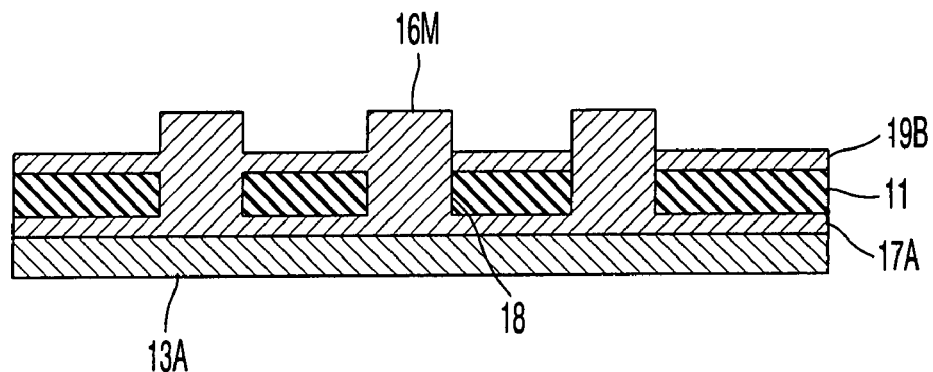
FIG. 22 is a cross-sectional view illustrating a state that the insulting layer has been removed from the laminate material.
Figure 23:
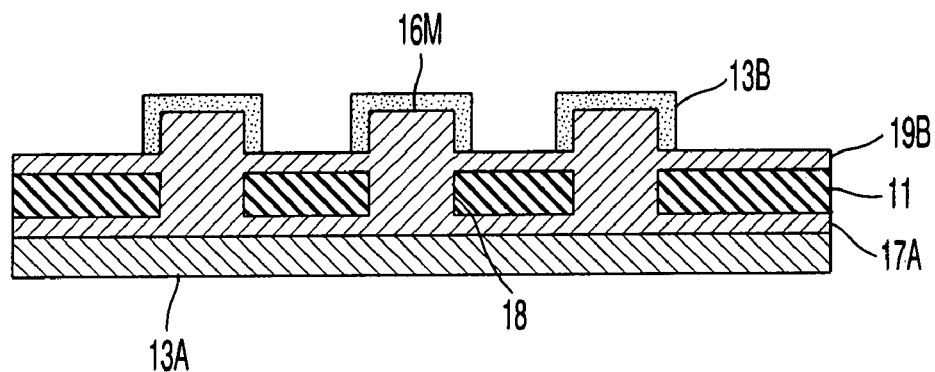
FIG. 23 is a cross-sectional view illustrating a state that resist films for etching have been formed on the surfaces of the front surface-side metal layer and the conductors for front-surface electrode parts.
Figure 24:
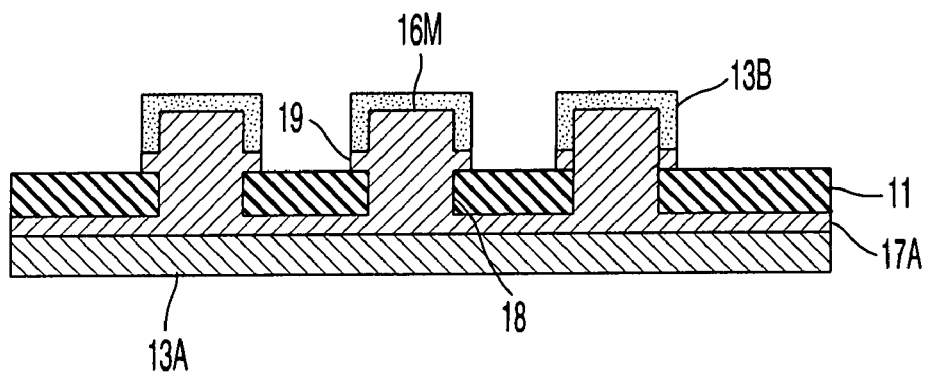
FIG. 24 is a cross-sectional view illustrating a state that the front surface-side metal layer has been subjected to an etching treatment to form holding parts.
Figure 25:
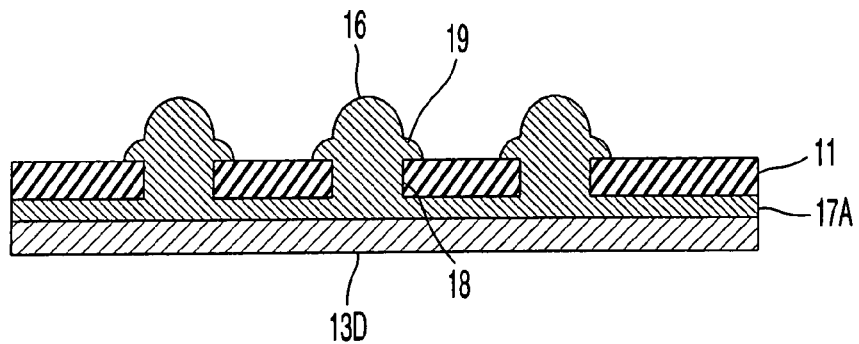
FIG. 25 is a cross-sectional view illustrating a state that the conductors for front-surface electrode parts have been subjected to an electrolytic etching treatment to form front-surface electrode parts.

The insulating layer 16B is removed from the laminate material 10B, in which the conductors 16M for front-surface electrode parts and short circuit parts 18 have been formed in such a manner, thereby exposing the conductors 16M for front-surface electrode parts and front surface-side metal layer 19B as illustrated in FIG. 22. A patterned resist film 13B is then formed so as to cover the conductors 16M for front-surface electrode parts and portions to become holding parts 19 in the front surface-side metal layer 19B as illustrated in FIG. 23. The front surface-side metal layer 19B is then subjected to an etching treatment to remove exposed portions, thereby forming holding parts 19 each continuously extending from a peripheral surface of a base end portion of the conductor 16M for front-surface electrode part outward and radially along the front surface of the insulating sheet 11 as illustrated in FIG. 24. After the resist film 13B is then removed to expose the respective conductors 16M for front-surface electrode parts and the respective holding parts 19, an electrolytic etching treatment is conducted to shape the respective conductors 16M for front-surface electrode parts, thereby forming front-surface electrode parts 16 each having a top portion in an almost semi-spherical form as illustrated in FIG. 25.

Figure 26:
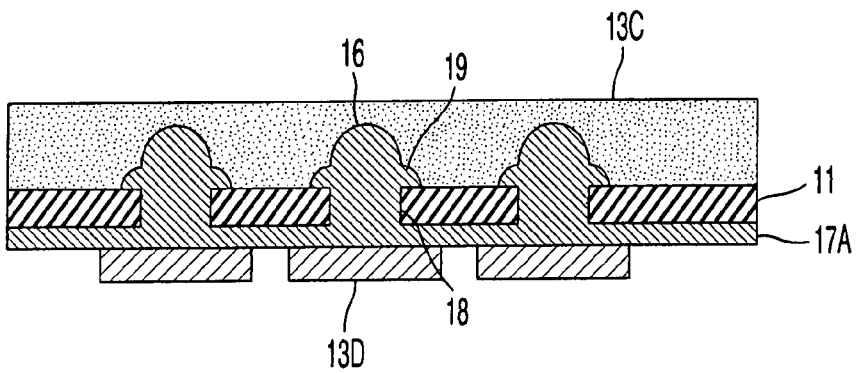
FIG. 26 is a cross-sectional view illustrating a state that a patterned resist film for etching has been formed on the surface of a back surface-side metal layer, and a resist film for etching has been formed on the surfaces of an insulating sheet, the front-surface electrode parts and holding parts.
Figure 27:
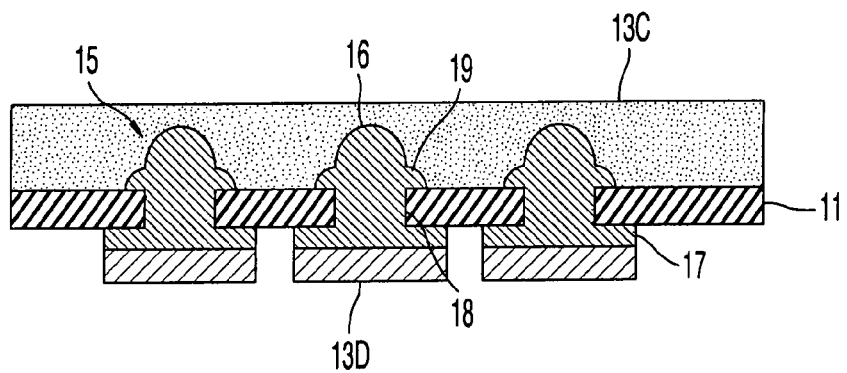
FIG. 27 is a cross-sectional view illustrating a state that the back surface-side metal layer has been removed to form back-surface electrode parts.

The resist film 13A on the back surface of the insulating sheet 11 is then subjected to photolithography, thereby forming a patterned resist film 13D so as to cover portions to become back-surface electrode parts in the back surface-side metal layer 17A and forming a resist film 13C so as to cover the front surface of the insulating sheet 11, the front-surface electrode parts 16 and the holding parts 19 as illustrated in FIG. 26. The back surface-side metal layer 17A is then subjected to an etching treatment to remove exposed portions, thereby forming back-surface electrode parts 17 respectively linked to the other ends of the short circuit parts 18 as illustrated in FIG. 27, thus resulting in the formation of the electrode structures 15.

The resist film 13C is then removed from the insulating sheet 11, front-surface electrode parts 16 and holding part 19, and the resist film 13D is removed from the back-surface electrode parts 17, thereby obtaining the second exemplary sheet-like connector 10 shown in FIG. 16.

According to such a second exemplary sheet-like connector, the same effects as in the first exemplary sheet-like connector are achieved.

Figure 28:
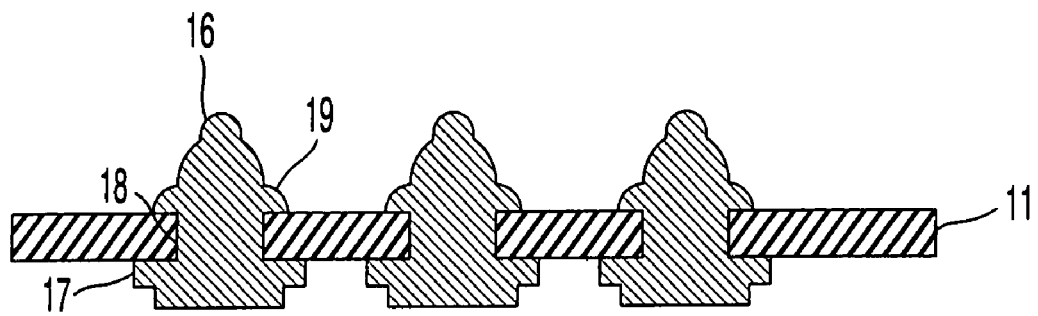
FIG. 28 is a cross-sectional view illustrating the construction of a third exemplary sheet-like connector according to the present invention.

FIG. 28 is a cross-sectional view illustrating the construction of a third exemplary sheet-like connector according to the present invention.

The third exemplary sheet-like connector 10 is used in a probe for conducting electrical inspection of circuit devices and has a flexible insulating sheet 11. In the insulating sheet 11, a plurality of electrode structures 15 composed of a metal and extending in a thickness-wise direction of the insulating sheet 11 are arranged in a state separated from one another in a plane direction of the insulating sheet 11 in accordance with a pattern corresponding to a pattern of electrodes to be inspected of a circuit device that is an object of inspection.

Each of the electrode structures 15 is composed of a protruding front-surface electrode part 16 exposed to a front surface of the insulating sheet 11 and projected from the front surface of the insulating sheet 11, a back-surface electrode part 17 exposed to a back surface of the insulating sheet 11, a columnar short circuit part 18 continuously extending from the base end of the front-surface electrode part 16 through the insulating sheet 11 in the thickness-wise direction thereof and linked to the back-surface electrode part 17, and a circular ring plate-like holding part 19 continuously extending from a peripheral surface of a base end portion of the front-surface electrode part 16 outward and radially along the front surface of the insulating sheet 11. In the electrode structure 15 of this embodiment, the front-surface electrode part 16 has an almost semi-spherical central portion, the diameter of which becomes small toward the tip end side from the base end side thereof, and an almost semi-spherical tip portion having a diameter smaller than the diameter of the central portion, the diameter of which becomes small toward the tip. The diameter of the base end of the front-surface electrode part 16 is equivalent to the diameter of one end of the short circuit part 18 continuous with the base end. On the other hand, the back-surface electrode part 17 has a rectangular flat plate-like base portion and a rectangular flat plate-like tip portion projected from this base portion and a size smaller than the base portion.

The above-described third exemplary sheet-like connector 10 can be produced, for example, in the following manner.

Figure 29:
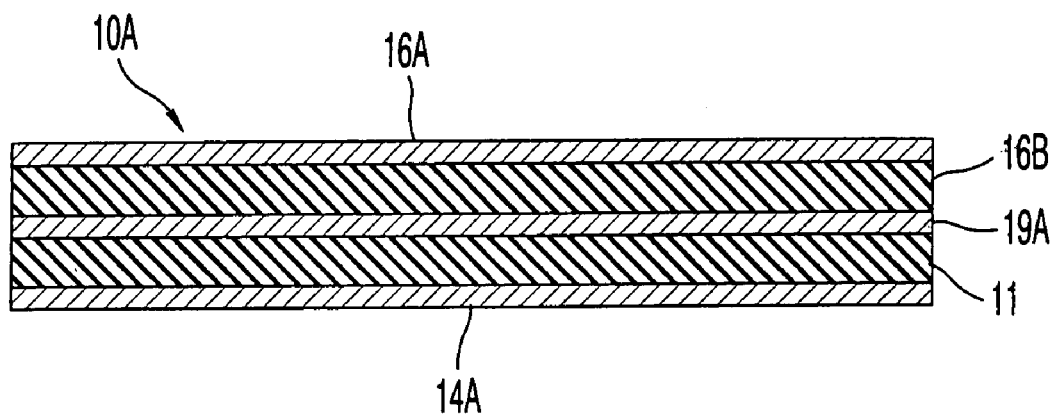
FIG. 29 is a cross-sectional view illustrating the construction of a laminate material for producing the third exemplary sheet-like connector.

As illustrated in FIG. 29, a laminate material 10A composed of an insulating sheet 11 formed of a polymeric material capable of being etched, for example, polyimide, a first front surface-side metal layer 19A formed on a front surface of the insulating sheet 11, an insulating layer 16B formed on the surface of the first front surface-side metal layer 19A and formed of a polymeric material capable of being etched, for example, polyimide, a second front surface-side metal layer 16A formed on the surface of the insulating layer 16B, and a back surface-side metal layer 17A formed on a back surface of the insulating sheet 11 is first provided.

In the laminate material 10A, the first front surface-side metal layer 19A is formed so as to have a thickness equivalent to the thickness of a holding part 19 in each of electrode structures 15 to be formed, the insulating layer 16B is formed so as to have a thickness equivalent to the thickness (height) of the central portion of the front-surface electrode part 19 in the electrode structure 15 to be formed, the second front surface-side metal layer 16A is formed so as to have a thickness equivalent to the thickness (height) of the tip portion of the front-surface electrode part 19 in the electrode structure 15 to be formed, and the back surface-side metal layer 17A is formed so as to have a thickness equivalent to a base portion of a back-surface electrode part 17 in the electrode structure 15 to be formed.

Figure 30A:
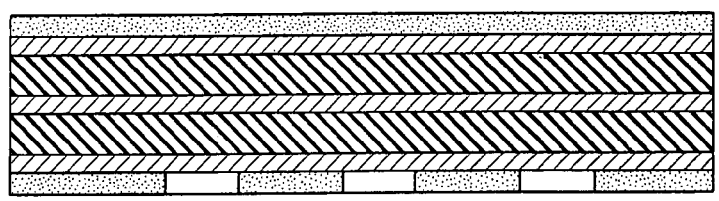
FIG. 30 is a cross-sectional view illustrating a process for forming recesses for forming electrode structures in the laminate material shown in FIG. 29.

To such a laminate material 10A, as illustrated in FIG. 30(a), a resist film 12A for etching is formed on the whole surface of the second front surface-side metal layer 16A, and a resist film 13 for etching, in which a plurality of patterned holes 13K have been formed in accordance with a pattern corresponding to a pattern of the electrode structures 15 to be formed, is formed on the surface of the back surface-side metal layer 17A.

Figure 30B:
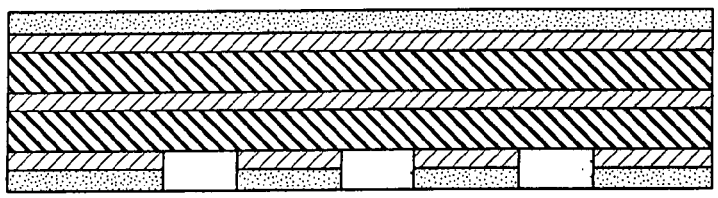
Figure 30C:
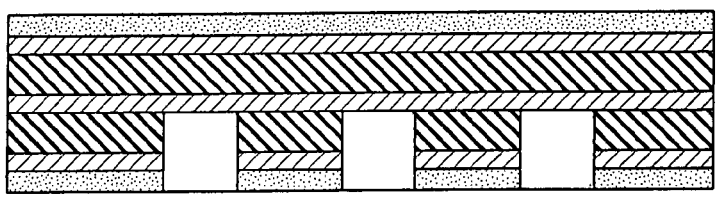
Figure 30D:
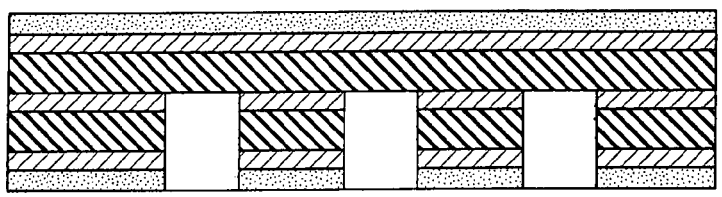
Figure 30E:
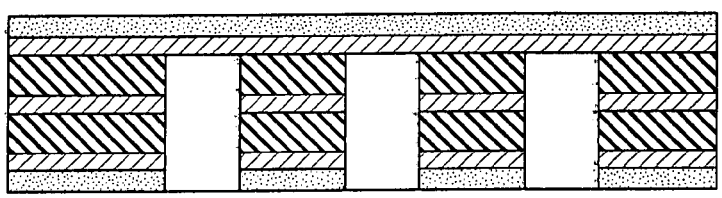

Exposed portions of the back surface-side metal layer 17A are then subjected to an etching treatment through the respective patterned holes 13K in the resist film 13 to remove such portions, thereby forming a plurality of through-holes 17H in the back surface-side metal layer 17A as illustrated in FIG. 30(b). Thereafter, exposed portions of the insulating sheet 11 are subjected to an etching treatment through the respective patterned holes 13K in the resist film 13 and the respective through-holes 17H in the back surface-side metal layer 17A to remove such portions, thereby forming, in the insulating sheet 11, a plurality of through-holes 11H each linked to the respective through-holes 17H in the back surface-side metal layer 17A as illustrated in FIG. 30(c). Thereafter, exposed portions of the first front surface-side metal layer 19A are subjected to an etching treatment through the respective patterned holes 13K in the resist film 13, the respective through-holes 17H in the back surface-side metal layer 17A and the respective through-holes 11H in the insulating sheet 11 to remove such portions, thereby forming, in the first front surface-side metal layer 19A, a plurality of through-holes 19H each linked to the respective through-holes 11H in the insulating sheet 11 as illustrated in FIG. 30(d). Further, exposed portions of the insulating layer 16B are subjected to an etching treatment through the respective patterned holes 13K in the resist film 13, the respective through-holes 17H in the back surface-side metal layer 17A, the respective through-holes 11H in the insulating sheet 11 and the respective through-holes 19H in the first front surface-side metal layer 19A to remove such portions, thereby forming, in the insulating layer 16B, a plurality of through-holes 16H each linked to the respective through-holes 19H in the first front surface-side metal layer 19A as illustrated in FIG. 30(e). A plurality of recesses 10K for forming electrode structures with the respective through-holes 17H in the back surface-side metal layer 17A, the respective through-holes 11H in the insulating sheet 11, the respective through-holes 19H in the first front surface-side metal layer 19A and the respective through-holes 16H in the insulating layer 16B linked to one another are thereby formed in the back surface of the laminate material 10A.

Figure 31:
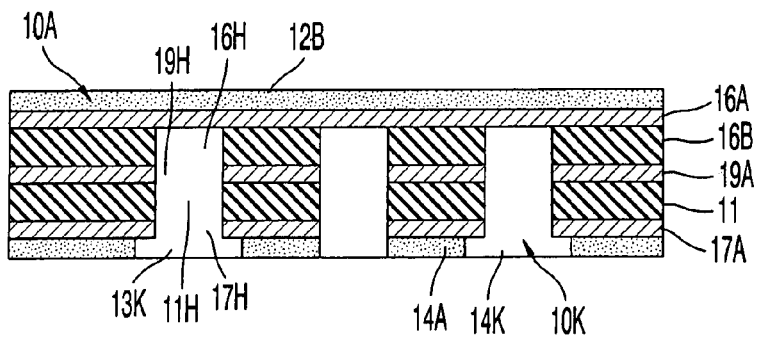
FIG. 31 is a cross-sectional view illustrating a state that resist films for plating have been formed on both surfaces of the laminate material, in which the recesses for forming electrode structures were formed.

After the resist films 12A and 13 are removed from the laminate material 10A, in which the recesses 10K for forming electrode structures have been formed in such a manner, as illustrated in FIG. 31, a resist film 12B for plating is formed on the laminate material 10A so as to cover the whole surface of the second front surface-side metal layer 16A, and a resist film 14A for plating, in which a plurality of patterned holes 14K have been formed in accordance with a pattern corresponding to a pattern of back-surface electrode parts 17 in the electrode structures 15 to be formed, is formed on the surface of the back surface-side metal layer 17A.

Figure 32:
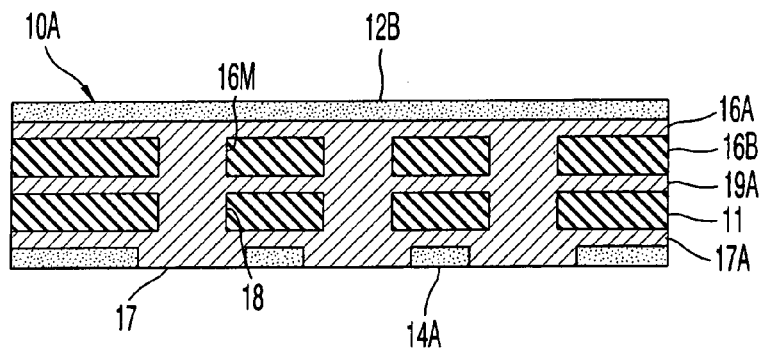
FIG. 32 is a cross-sectional view illustrating a state that a metal has been filled into the recesses for forming electrode structures.

The laminate material 10A is then subjected to an electroplating treatment by using the second front surface-side metal layer 16A as an electrode to fill a metal into the respective recesses 10K for forming electrode structures and the respective patterned holes 14K in the resist film 14A, thereby forming a plurality of protruding conductors 16M for front-surface electrode parts projected from the front surface of the insulating sheet 11, short circuit parts 18 continuously extending from the respective base ends of the conductors 16M for front-surface electrode parts through the insulating sheet 11 in a thickness-wise direction thereof, and back-surface electrode parts 17 respectively linked to the other ends of the short circuit parts 18 as illustrated in FIG. 32. In this state, each of the conductors 16M for front-surface electrode parts are in a state connected to one another through the second front surface-side metal layer 16A, and each of the back-surface electrode parts 17 are in a state connected to one another through the back surface-side metal layer 17A.

Figure 33:
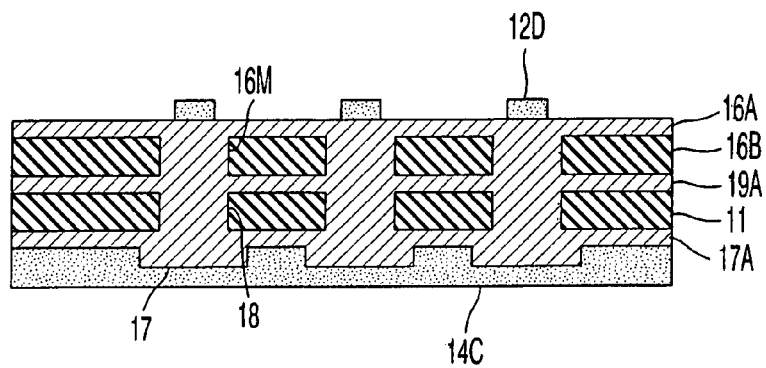
FIG. 33 is a cross-sectional view illustrating a state that resist films for etching have been formed on the respective surfaces of a second front surface-side metal layer, back-surface electrode parts and back surface-side metal layer.
Figure 34:
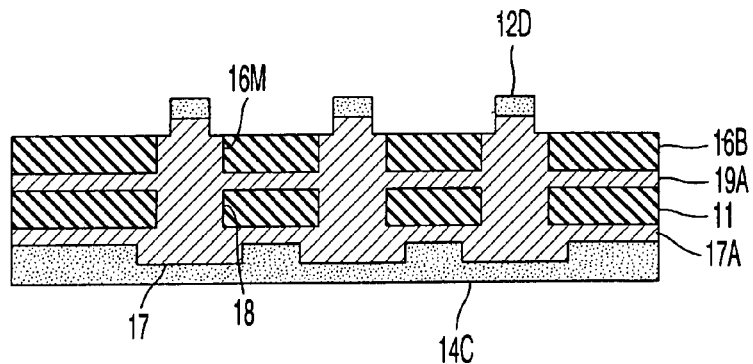
FIG. 34 is a cross-sectional view illustrating a state that the second front surface-side metal layer has been subjected to an etching treatment to form conductors for front-surface electrode parts having a top portion projected from a central portion.

After the resist films 12B and 14A are removed from the laminate material 10A, in which the conductors 16M for front-surface electrode parts, short circuit parts 18 and back-surface electrode parts 17 have been formed in such a manner, as illustrated in FIG. 33, a resist film 14C for etching is formed so as to cover the back-surface electrode parts 17 and back surface-side metal layer 17A, and a patterned resist film 12D for etching is formed on the surface of the second front surface-side metal layer 16A in accordance with a pattern corresponding to a pattern of the tip portions of the front-surface electrode parts 16 to be formed to subject the second front surface-side metal layer 16A to an etching treatment, thereby removing exposed portions to form a plurality of conductors 16M for front-surface electrode parts, which each have a columnar central portion and a tip portion having a diameter smaller than the diameter of the central portion and are separated from one another, as illustrated in FIG. 34.

Figure 35:
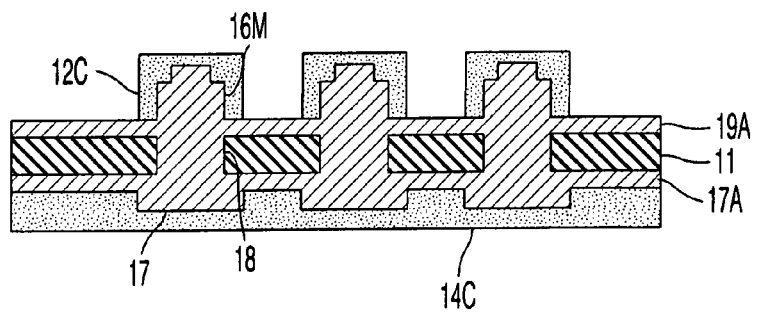
FIG. 35 is a cross-sectional view illustrating a state that resist films for etching have been formed on the surfaces of a first front surface-side metal layer and the conductors for front-surface electrode parts.
Figure 36:
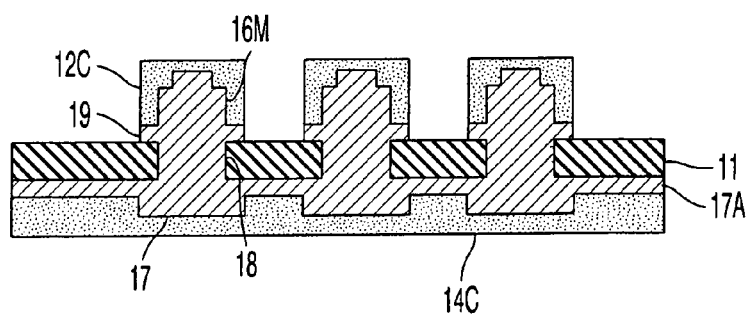
FIG. 36 is a cross-sectional view illustrating a state that the first front surface-side metal layer has been subjected to an etching treatment to form holding parts.
Figure 37:
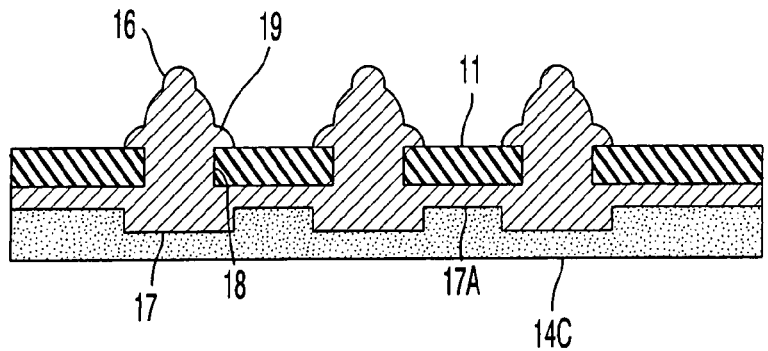
FIG. 37 is a cross-sectional view illustrating a state that the conductors for front-surface electrode parts have been subjected to an electrolytic etching treatment to form front-surface electrode parts.

The resist film 12D is then removed, and the insulating layer 16B is subjected to an etching treatment to remove the whole thereof, thereby exposing the conductors 16M for front-surface electrode parts and the first front surface-side metal layer 19A. Thereafter, as illustrated in FIG. 35, a patterned resist film 12C for etching is formed so as to cover the conductors 16M for front-surface electrode parts and portions to become holding parts 19 in the first front surface-side metal layer 19A. The first front surface-side metal layer 19A is then subjected to an etching treatment to remove exposed portions, thereby forming a plurality of holding parts 19 each continuously extending from a peripheral surface of a base end portion of the conductor 16M for front-surface electrode part outward and radially along the front surface of the insulating sheet 11 as illustrated in FIG. 36. After the resist films 12C are then removed to expose the conductors 16M for front surface electrode parts and holding parts 19, an electrolytic etching treatment is conducted to shape the conductors 16M for front surface electrode parts, thereby forming front surface electrode parts 16 each having an almost semi-spherical central portion and an almost semi-spherical tip portion projected from the central portion as illustrated in FIG. 37.

Figure 38:
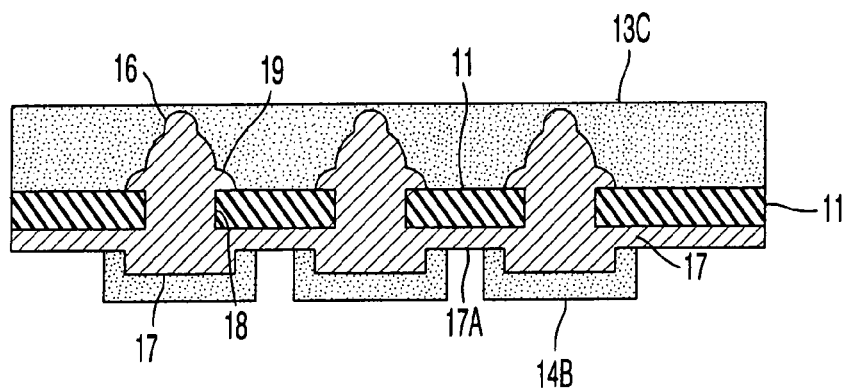
FIG. 38 is a cross-sectional view illustrating a state that resist films for etching have been formed on the surfaces of the back-surface electrode parts, and a resist film for etching has been formed on the surfaces of an insulating sheet, the front-surface electrode parts and the holding parts.
Figure 39:
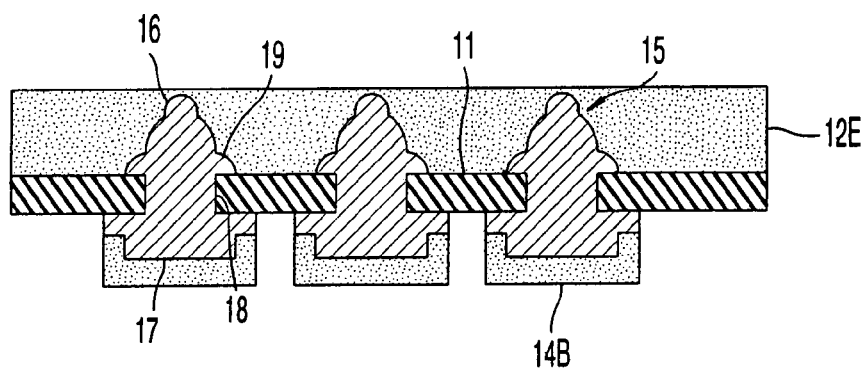
FIG. 39 is a cross-sectional view illustrating a state that the back surface-side metal layer has been removed to form the back-surface electrode parts separated from one another.

The resist film 14C is then subjected to photolithography, thereby forming a patterned resist film 14B for etching so as to cover the back-surface electrode parts 17 as illustrated in FIG. 38, and a resist film 12E for etching is formed so as to cover the front surface of the insulating sheet 11, the front-surface electrode parts 16 and the holding parts 19 to subject the back surface-side metal layer 17A to an etching treatment, thereby removing exposed portions to form a plurality of back-surface electrode parts 17 separated from one another as illustrated in FIG. 39, thus resulting in the formation of the electrode structures 15.

The resist films 12E and 14B are then removed, thereby obtaining the third exemplary sheet-like connector 10 shown in FIG. 28.

According to such a third exemplary sheet-like connector, the same effects as in the first exemplary sheet-like connector are achieved.

Figure 40:
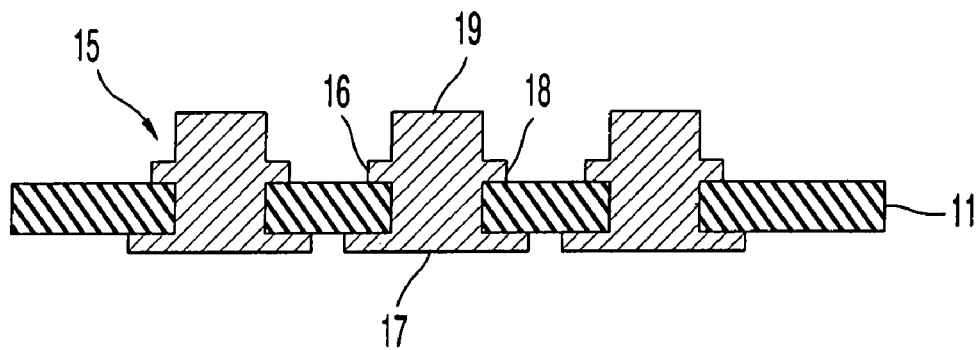
FIG. 40 is a cross-sectional view illustrating the construction of a fourth exemplary sheet-like connector according to the present invention.

FIG. 40 is a cross-sectional view illustrating the construction of a fourth exemplary sheet-like connector according to the present invention.

The fourth exemplary sheet-like connector 10 has the same construction as that of the second sheet-like connector except that the electrode structures 15 each has a columnar front-surface electrode part 16, and can be produced in the same manner as the production process of the second sheet-like connector except that the conductors for front-surface electrode parts are provided as the front-surface electrode parts 16 without conducting an electrolytic etching treatment to the conductors for front-surface electrode parts as they are.

According the fourth sheet-like connector, the same effects as in the first exemplary sheet-like connector are achieved.

[Probe for Circuit Inspection and Inspection Apparatus for Circuit Device]

Figure 41:
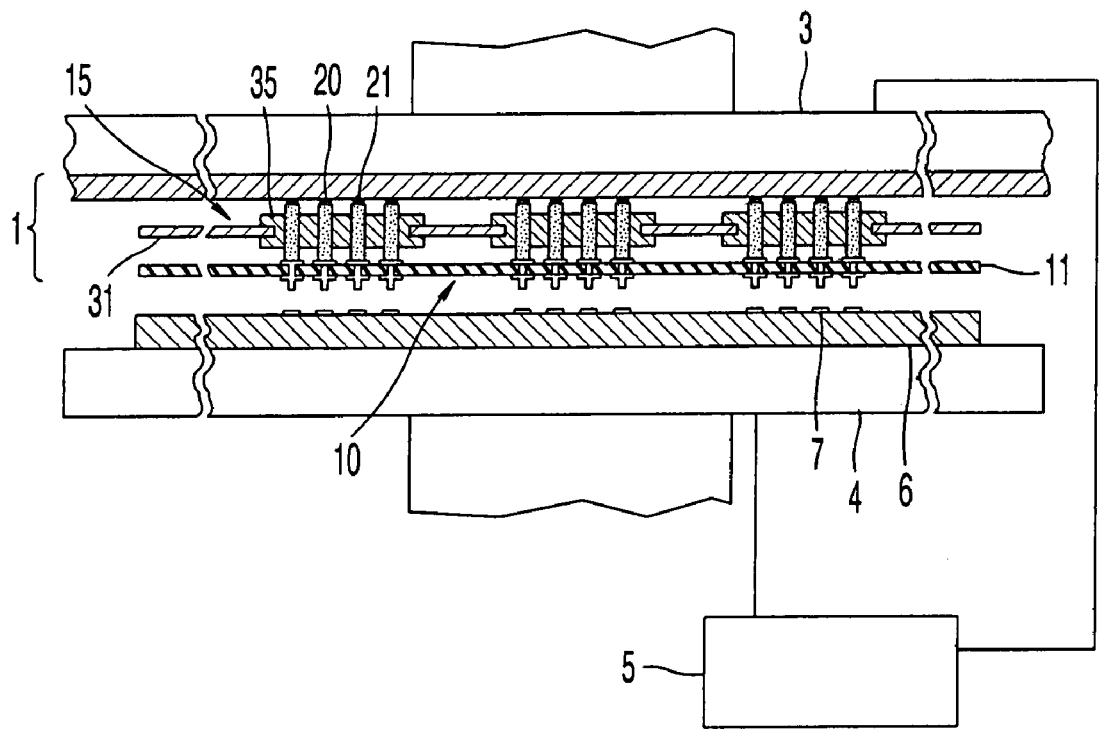
FIG. 41 is a cross-sectional view illustrating the construction of an exemplary inspection apparatus for circuit devices according to the present invention.

FIG. 41 is a cross-sectional view illustrating the construction of an exemplary inspection apparatus for circuit devices according to the present invention. This inspection apparatus for circuit devices is suitable for respectively conducting electrical inspection of a plurality of integrated circuits formed on a wafer in a state of the wafer.

This inspection apparatus for circuit devices has a probe 1 for circuit inspection for conducting electrical connection between respective electrodes 7 to be inspected of a wafer 6, which is a circuit device to be inspected, and a tester. As illustrated on an enlarged scale in FIG. 42 also, this probe 1 for circuit inspection has a circuit board 20 for inspection, on the front surface (lower surface in the drawing) of which a plurality of inspection electrodes 21 have been formed in accordance with a pattern according to a pattern of the electrodes 7 to be inspected in all integrated circuits formed on the wafer 6. An anisotropically conductive connector 30 is arranged on the front surface of the circuit board 20 for inspection, and the sheet-like connector 10 of the construction shown in FIG. 1, in which a plurality of the electrode structures 15 have been arranged in accordance with the pattern according to the pattern of the electrodes 7 to be inspected in all the integrated circuits formed on the wafer 6, is arranged on a front surface (lower surface in the drawing) of the anisotropically conductive connector 30.

On a back surface (upper surface in the drawing) of the circuit board 20 for inspection in the probe 1 for circuit inspection, is provided a pressurizing plate 3 for pressurizing the probe 1 for circuit inspection downward. A wafer-mounting table 4, on which the wafer 6 is mounted, is provided below the probe 1 for circuit inspection. A heater 5 is connected to both pressurizing plate 3 and wafer-mounting table 4.

As a material for forming the circuit board 20 for inspection, may be used any of conventionally known various materials for boards, and specific examples thereof include composite resin materials such as glass fiber-reinforced epoxy resins, glass fiber-reinforced phenol resins, glass fiber-reinforced polyimide resins and glass fiber-reinforced bismaleimide triazine resins, and ceramic materials such as glass, silicon dioxide and alumina.

When an inspection apparatus for conducting a WLBI test is constructed, that having a coefficient of linear thermal expansion of preferably at most $3\times10^{-5}$/K, more preferably $1\times10^{-7}$ to $1\times10^{-5}$/K, particularly preferably $1\times10^{-6}$ to $6\times10^{-6}$/K is used.

Specific examples of such a board material include Pyrex (trademark) glass, quartz glass, alumina, beryllia, silicon carbide, aluminum nitride and boron nitride.

The anisotropically conductive connector 30 is formed by a frame plate 31, in which a plurality of openings 32 have been formed correspondingly to electrode regions, in which electrodes to be inspected in the whole of the integrated circuits formed on the wafer, which is a circuit device to be inspected, have been arranged, and a plurality of anisotropically conductive sheets 35 arranged so as to close the respective openings in the frame plate 31 and fixed to and supported by respective opening edges of the frame plate 31.

No particular limitation is imposed on a material for forming the frame plate 31 so far as it has such stiffness as the resulting frame plate 31 is hard to be deformed, and the shape thereof is stably retained. For example, various kinds of materials such as metallic materials, ceramic materials and resin materials may be used. When the frame plate 31 is formed by, for example, a metallic material, an insulating film may be formed on the surface of the frame plate 31.

Specific examples of the metallic material for forming the frame plate 31 include metals such as iron, copper, nickel, chromium, cobalt, magnesium, manganese, molybdenum, indium, lead, palladium, titanium, tungsten, aluminum, gold, platinum and silver, and alloys or alloy steels composed of a combination of at least two of these metals.

Specific examples of the resin material forming the frame plate 31 include liquid crystal polymers and polyimide resins.

When The inspection apparatus is that for conducting a WLBI (wafer level burn-in) test, the material for forming the frame plate 31 preferably has a coefficient of linear thermal expansion of at most $3\times10^{-5}$/K, more preferably $-1\times10^{-7}$ to $1\times10^{-5}$/K, particularly preferably $1\times10^{-6}$ to $8\times10^{-6}$/K.

Specific examples of such a material include alloys or alloy steels of magnetic metals, such as invar alloys such as invar, Elinvar alloys such as Elinvar, superinvar, covar and 42 alloy.

No particular limitation is imposed on the thickness of the frame plate 31 so far as the shape thereof is retained, and the anisotropically conductive sheet 35 can be supported. Although the specific thickness thereof varies depending on the material, it is preferably, for example, 45 to 600 μm, more preferably 40 to 400 μm.

Each of the anisotropically conductive sheets 35 is formed by an elastic polymeric substance and composed of a plurality of conductive parts 36 formed in accordance with a pattern corresponding to a pattern of electrodes 7 to be inspected in an electrode region formed on the wafer 6, which is a circuit board to be inspected, and each extending in a thickness-wise direction of the sheet, and insulating parts 37 mutually insulating these respective conductive parts 36. In the illustrated embodiment, projected portions 38 protruding from other surfaces than portions, at which the conductive parts 36 and peripheral portions thereof are located, are formed at those portions on both sides of the anisotropically conductive sheet 35.

In the respective conductive parts 36 in the anisotropically conductive sheet 35, conductive particles P exhibiting magnetism are contained at a high density in a state oriented so as to align in the thickness-wise direction. On the other hand, the insulating parts 37 do not contain the conductive particles P at all or scarcely contain them.

The overall thickness (thickness of the conductive part 36 in the illustrated embodiment) of the anisotropically conductive sheet 35 is preferably 50 to 2,000 μm, more preferably 70 to 1,000 μm, particularly preferably 80 to 500 μm. When this thickness is 50 μm or greater, sufficient strength is imparted to such an anisotropically conductive sheet 35. When this thickness is 2,000 μm or smaller on the other hand, conductive parts 36 having necessary conductive properties are provided with certainty.

The projected height of the projected portion 38 is preferably at least 10% in total of the thickness of the projected portion 38, more preferably at least 15%. Projected portions 38 having such a projected height are formed, whereby the conductive parts 36 are sufficiently compressed by small pressing force, so that good conductivity is surely achieved.

The projected height of the projected portion 38 is preferably at most 100%, more preferably at most 70% of the shortest width or diameter of the projected portion 38. Projected portions 38 having such a projected height are formed, whereby the projected portions 38 are not buckled when they are pressurized, so that the prescribed conductivity is surely achieved.

The elastic polymeric substance forming the anisotropically conductive sheet 35 is preferably a heat-resistant polymeric substance having a crosslinked structure. As curable polymeric substance-forming materials usable for obtaining such a crosslinked polymeric substance, various materials may be used. However, liquid silicone rubber is preferred.

The liquid silicone rubber may be any of addition type and condensation type. However, addition type liquid silicone rubber is preferred. This addition type liquid silicone rubber is that cured by a reaction of a vinyl group with an Si—H bond and includes a one-pack type (one-component type) composed of polysiloxane having both vinyl group and Si—H bond and a two-pack type (two-component type) composed of polysiloxane having a vinyl group and polysiloxane having an Si—H bond. In the present invention, addition type liquid silicone rubber of the two-pack type is preferably used.

When the anisotropically conductive sheet 35 is formed by a cured product (hereinafter referred to as "cured silicon rubber") of the liquid silicone rubber, the cured silicone rubber preferably has a compression set of at most 10%, more preferably at most 8%, still more preferably at most 6% at 150° C. If the compression set exceeds 10%, the conductive parts 36 tend to cause permanent set when the resulting anisotropically conductive connector is used repeatedly over many times or used repeatedly under high-temperature environment, whereby chains of the conductive particles P in the conductive parts 36 are disordered. As a result, it is difficult to retain the necessary conductivity.

In the present invention, the compression set of the cured silicone rubber can be measured by a method in accordance with JIS K 6249.

The cured silicone rubber preferably has a durometer A hardness of 10 to 60, more preferably 15 to 55, particularly preferably 20 to 50 at 23° C.

If the durometer A hardness is lower than 10, the insulating parts 37 mutually insulating the conductive parts 36 are easily over-distorted when pressurized, and it may be difficult in some cases to retain the necessary insulating property between the conductive parts 36. If the durometer A hardness exceeds 60 on the other hand, pressurizing force by a considerably heavy load is required for giving proper distortion to the conductive parts 36, so that the wafer, which is a circuit board to be inspected, tends to cause great deformation or breakage.

Further, if that having a durometer A hardness outside the above range is used as the cured silicone rubber, the conductive parts 36 tend to cause permanent set when the resulting anisotropically conductive connector is used repeatedly-over many times, whereby chains of the conductive particles in the conductive parts 36 are disordered. As a result, it is difficult to retain the necessary conductivity.

When an inspection apparatus for conducting a WLBI test is constructed, the cured silicone rubber for forming the anisotropically conductive sheet 35 preferably has a durometer A hardness of 25 to 40 at 23° C.

If that having a durometer A hardness outside the above range is used as the cured silicone rubber, the conductive parts 36 tend to cause permanent set when the WLBI test is conducted repeatedly, whereby chains of the conductive particles in the conductive parts 36 are disordered. As a result, it is difficult to retain the necessary conductivity.

In the present invention, the durometer A hardness of the cured silicone rubber can be measured by a method in accordance with JIS K 6249.

Further, the cured silicone rubber preferably has tear strength of at least 8 kN/m, more preferably at least 10 kN/m, still more preferably at least 15 kN/m, particularly preferably at least 20 kN/m at 23° C. If the tear strength is lower than 8 kN/m, the resulting anisotropically conductive sheet 35 tends to deteriorate durability when it is distorted in excess.

In the present invention, the tear strength of the cured silicone rubber can be measured by a method in accordance with JIS K 6249.

In the present invention, a proper curing catalyst may be used for curing the addition type liquid silicone rubber. As such a curing catalyst, may be used a platinum-containing catalyst. Specific examples thereof include publicly known catalysts such as platinic chloride and salts thereof, platinum-unsaturated group-containing siloxane complexes, vinylsiloxane-platinum complexes, platinum-1,3-divinyltetramethyldisiloxane complexes, complexes of triorganophosphine or phosphine and platinum, acetyl acetate platinum chelates, and cyclic diene-platinum complexes.

The amount of the curing catalyst used is suitably selected in view of the kind of the curing catalyst and other curing treatment conditions. However, it is generally 3 to 15 parts by weight per 100 parts by weight of the addition type liquid silicone rubber.

In order to, for example, improve the thixotropic property of the addition type liquid silicone rubber, adjust the viscosity, improve the dispersion stability of the conductive particles or provide a base material having high strength, a general inorganic filler such as silica powder, colloidal silica, aerogel silica or alumina may be contained in the addition type liquid silicone rubber as needed.

As the conductive particles P contained in the conductive parts 36, may preferably be used particles obtained by coating the surfaces of core particles (hereinafter also referred to as "magnetic core particles") exhibiting magnetism with high-conductive metal.

The term "high-conductive metal" as used herein means a metal having a conductivity of at least $5 \times 10^6 \, \Omega^{-1} \mathrm{m}^{-1}$ at 0° C.

The magnetic core particles for obtaining the conductive particles P preferably have a number average particle diameter of 3 to 40 μm.

The number average particle diameter of the magnetic core particles means a value measured by a laser diffraction scattering method.

When the number average particle diameter is 3 μm or greater, conductive parts 36 easy to be deformed under pressure, low in resistance value and high in connection reliability can be easily obtained. When the number average particle diameter is 40 μm or smaller on the other hand, minute conductive parts 36 can be easily formed, and the resultant conductive parts 36 tend to have stable conductivity.

Further, the magnetic core particles preferably have a BET specific surface area of 10 to 500 m²/kg, more preferably 20 to 500 m²/kg, particularly preferably 50 to 400 m²/kg.

When the BET specific surface area is 10 m²/kg or wider, such magnetic core particles can be surely plated in a required amount because an area capable of being plated in the magnetic core particles is sufficiently wide. Accordingly, conductive particles P high in conductivity can be obtained, and stable and high conductivity is achieved because a contact area between the conductive particles P is sufficiently wide. When the BET specific surface area is 500 m²/kg or smaller on the other hand, such magnetic core particles do not become brittle, so that they are not broken when physical stress is applied, and stable and high conductivity is retained.

Further, the magnetic core particles preferably have a coefficient of variation of particle diameter of at most 50%, more preferably at most 40%, still more preferably at most 30%, particularly preferably at most 20%.

The coefficient of variation of particle diameter is a value determined in accordance with the expression: $(\sigma/Dn) \times 100$, wherein $\sigma$ is a standard deviation value of the particle diameter, and Dn is a number average particle diameter of the particles.

When the coefficient of variation of particle diameter is 50% or lower, conductive parts 36 narrow in scatter of conductivity can be formed because the evenness of particle diameter is high.

As a material for forming the magnetic core particles, may be used iron, nickel, cobalt, a material obtained by coating such a metal with copper or a resin, or the like. Those having a saturation magnetization of at least 0.1 $Wb/m^2$ may be preferably used. The saturation magnetization thereof is more preferably at least 0.3 $Wb/m^2$, particularly preferably at least 0.5 $Wb/m^2$. Specific examples of the material include iron, nickel, cobalt and alloys thereof.

As the high-conductive metal applied to the surfaces of the magnetic core particles, may be used gold, silver, rhodium, platinum, chromium or the like. Among these, gold is preferably used in that it is chemically stable and has a high electric conductivity.

In the conductive particles P, a proportion [(mass of high-conductive metal/mass of core particles)×100] of the high-conductive metal to the core particles is at least 15% by mass, preferably 25 to 35% by mass.

If the proportion of the high-conductive metal is lower than 15% by mass, the conductivity of such conductive particles P is markedly deteriorated when the resulting anisotropically conductive connector is used repeatedly under high-temperature environment. As a result, the necessary conductivity cannot be retained.

The BET specific surface area of the conductive particles P is preferably 10 to 500 $m^2/kg$.

When the BET specific surface area is 10 $m^2/kg$ or wider, the surface area of the coating layer becomes sufficiently great, so that the coating layer great in the total weight of the high-conductive metal can be formed. Accordingly, particles high in conductivity can be obtained. In addition, stable and high conductivity can be achieved because a contact area among the conductive particles P is sufficiently wide. When the BET specific surface area is 500 $m^2/kg$ or smaller on the other hand, such conductive particles do not become brittle, and thus they are not broken when physical stress is applied thereto, and the stable and high conductivity is retained.

The number average particle diameter of the conductive particles P is preferably 3 to 40 μm, more preferably 6 to 25 μm.

When such conductive particles P are used, the resulting anisotropically conductive sheet 35 becomes easy to be deformed under pressure. In addition, sufficient electrical connection is achieved between the conductive particles P in the conductive parts 36.

No particular limitation is imposed on the shape of the conductive particles P. However, they are preferably in the shape of a sphere or star, or a mass of secondary particles obtained by agglomerating these particles in that these particles can be easily dispersed in the polymeric substance-forming material.

The content of water in the conductive particles P is preferably at most 5% by mass, more preferably at most 3% by mass, further preferably at most 2% by mass, particularly preferably at most 1% by mass. By satisfying such conditions, bubbling can be prevented or inhibited upon the curing treatment in the formation of the anisotropically conductive sheet 35.

The conductive particles P may be those obtained by treating surfaces thereof with a coupling agent such as a silane coupling agent. By treating the surfaces of the conductive particles P with the coupling agent, the adhesion property of the conductive particles P to the elastic polymeric substance is improved. As a result, the resulting anisotropically conductive sheet 35 becomes high in durability upon repeated use.

The amount of the coupling agent used is suitably selected within limits not affecting the conductivity of the conductive particles P. However, it is preferably such an amount that a coating rate (proportion of an area coated with the coupling agent to the surface area of the conductive particles) of the coupling agent on the surfaces of the conductive particles P amounts to at least 5%, more preferably 7 to 100%, further preferably 10 to 100%, particularly preferably 20 to 100%.

Such conductive particles P may be obtained in accordance with, for example, the following process.

Particles are first formed by commercial process from a ferromagnetic material, or commercially available particles of a ferromagnetic substance are provided. The particles are subjected to a classifying treatment to prepare magnetic core particles having a required particle diameter.

The classification treatment of the particles can be conducted by means of, for example, a classifier such as an air classifier or sonic classifier.

Specific conditions for the classification treatment are suitably preset according to the intended number average particle diameter of the magnetic core particles, the kind of the classifier, and the like.

Surfaces of the magnetic core particles are then treated with an acid and further washed with, for example, purified water, thereby removing impurities such as dirt, foreign matter and oxidized films present on the surfaces of the magnetic core particles. Thereafter, the surfaces of the magnetic core particles are coated with a high-conductive metal, thereby obtaining conductive particles.

As examples of the acid used for treating the surfaces of the magnetic core particles, may be mentioned hydrochloric acid.

As a method for coating the surfaces of the magnetic core particles with the high-conductive metal, may be used electroless plating, displacement plating or the like. However, the method is not limited to these methods.

A process for producing the conductive particles by the electroless plating or displacement plating will be described. The magnetic core particles subjected to the acid treatment and washing treatment are first added to a plating solution to prepare a slurry, and electroless plating or displacement plating on the magnetic core particles is conducted while stirring the slurry. The particles in the slurry are then separated from the plating solution. Thereafter, the particles separated are subjected to a washing treatment with, for example, purified water, thereby obtaining conductive particles with the surfaces of the magnetic core particles coated with the high-conductive metal.

Alternatively, primer plating may be conducted on the surfaces of the magnetic core particles to form a primer plating layer, and a plating layer composed of the high-conductive metal may be then formed on the surface of the primer plating layer. No particular limitation is imposed on the process for forming the primer plating layer and the plating layer formed thereon. However, it is preferable to form the primer plating layer on the surfaces of the magnetic core particles by the electroless plating and then form the plating layer composed of the high-conductive metal on the surface of the primer plating layer by the displacement plating.

No particular limitation is imposed on the plating solution used in the electroless plating or displacement plating, and various kinds of commercially available plating solutions may be used.

Since conductive particles having a great particle diameter may be produced due to aggregation of the magnetic core particles upon the coating of the surfaces of the magnetic core particles with the high-conductive metal, the resulting conductive particles are preferably classified as needed. By conducting the classification treatment, the conductive particles having the expected particle diameter can be surely obtained.

As examples of a classifier used for conducting the classification treatment of the conductive particles, may be mentioned those exemplified as the classifier used in the classification treatment of the magnetic core particles.

The proportion of the conductive particles P contained in the conductive parts 36 is preferably 10 to 60%, more preferably 15 to 50% in terms of volume fraction. If this proportion is lower than 10%, conductive parts 36 sufficiently low in electric resistance value may not be obtained in some cases. If the proportion exceeds 60% on the other hand, the resulting conductive parts 36 are liable to be brittle, so that elasticity required of the conductive parts 36 may not be achieved in some cases.

Such an anisotropically conductive connector as described above can be produced in accordance with, for example, the process described in Japanese Patent Application Laid-Open No. 2002-324600.

In the above-described inspection apparatus, a wafer 6, which is an object of inspection, is mounted on the wafer-mounting table 4, and the probe 1 for circuit inspection is then pressurized downward by the pressurizing plate 3, whereby the respective front-surface electrode parts 16 in the electrode structures 15 of the sheet-like connector 10 thereof are brought into contact with their corresponding electrodes 7 to be inspected of the wafer 6, and moreover the respective electrodes 7 to be inspected of the wafer 6 are pressurized by the front-surface electrodes parts 16. In this state, the conductive parts 36 in the anisotropically conductive sheets 35 of the anisotropically conductive connector 30 are respectively held and pressurized by the inspection electrodes 21 of the circuit board 20 for inspection and the back-surface electrode parts 17 in the electrode structures 15 of the sheet-like connector 10 and compressed in the thickness-wise direction of the anisotropically conductive sheets, whereby conductive paths are formed in the respective conductive parts 36 in the thickness-wise direction thereof. As a result, electrical connection between the electrodes 7 to be inspected of the wafer 6 and the inspection electrodes 21 of the circuit board 20 for inspection is achieved. Thereafter, the wafer 6 is heated to a prescribed temperature by the heater 5 through the wafer-mounting table 4 and pressurizing plate 3. In this state, necessary electrical inspection is curried out on each of a plurality of integrated circuits on the wafer 6.

According to the above-described probe for circuit inspection, the sheet-like connector 10 shown in FIG. 1 is provided, so that a stable electrically connected state can be surely achieved even to a wafer 6, on which electrodes 7 to be inspected have been formed at a small pitch. In addition, since the electrode structures 15 in the sheet-like connector 10 are prevented from falling off, high durability is achieved.

According to the inspection apparatus described above, the probe 1 for circuit inspection having the sheet-like connector 10 shown in FIG. 1 is provided, so that a stable electrically connected state can be surely achieved even to a wafer 6, on which electrodes 7 to be inspected have been formed at a small pitch. In addition, inspection can be performed with high reliability over a long period of time even when the inspection is conducted as to a great number of wafers, since the probe 1 for circuit inspection have high durability.

The inspection apparatus for circuit devices according to the present invention is not limited to the above-described embodiments, and various changes or modifications may be added thereto as described below.

Figure 42:
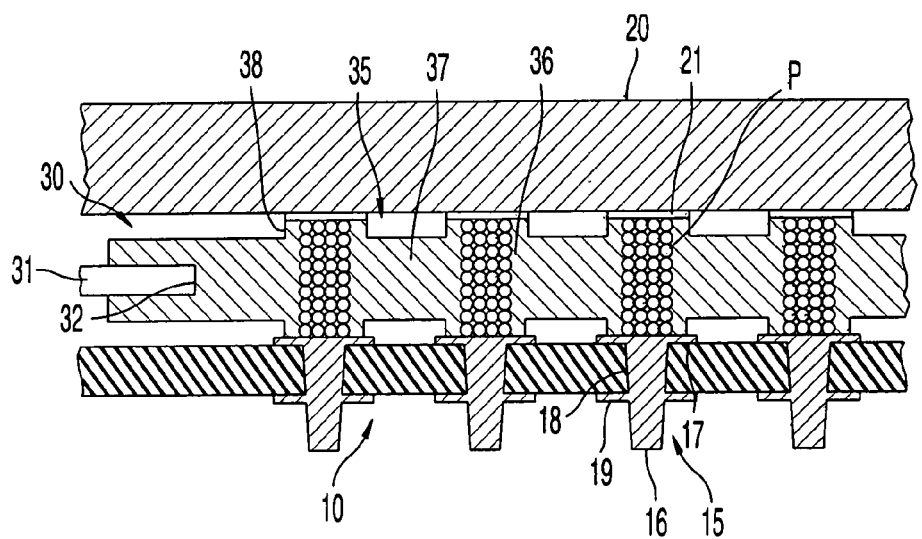
FIG. 42 is a cross-sectional view illustrating, on an enlarged scale, a probe for circuit inspection in the inspection apparatus shown in FIG. 41.
Figure 43:
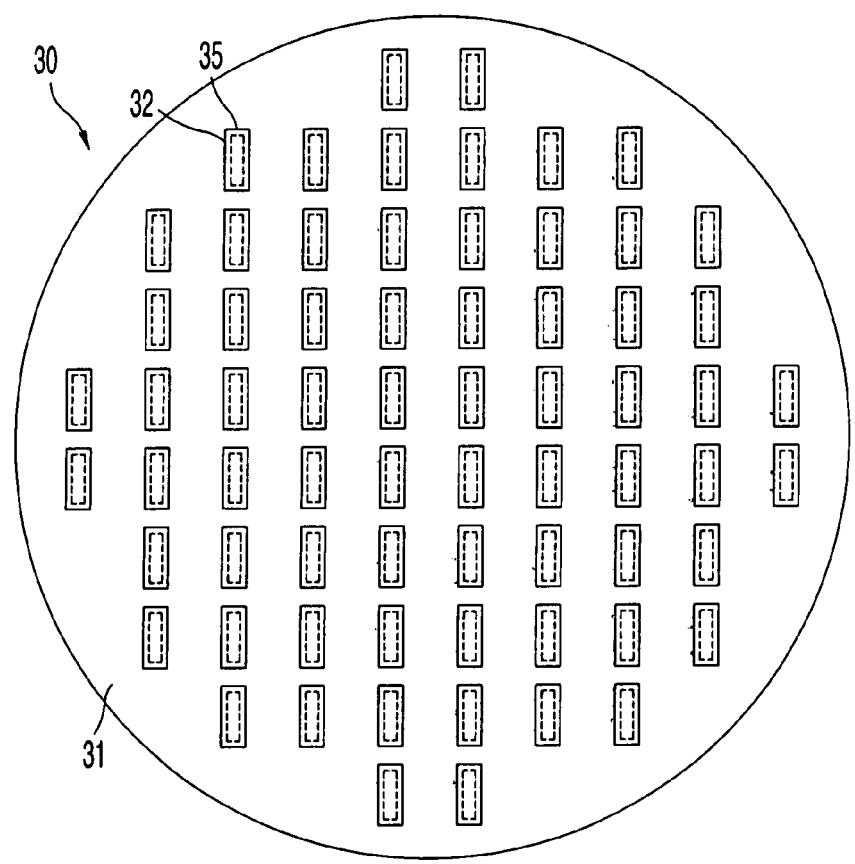
FIG. 43 is a plan view of an anisotropically conductive connector in the probe for circuit inspection shown in FIG. 42.

(1) The probe 1 for circuit inspection shown in FIGS. 41 and 42 is intended to achieve electrical connection collectively as to electrodes 7 to be inspected of all integrated circuits formed on a wafer 6. However, it may be intended to achieve electrical connection as to electrodes 7 to be inspected of a plurality of integrated circuits selected from among all the integrated circuits formed on the wafer 6. The number of integrated circuits selected is suitably selected in view of the size of the wafer 6, the number of integrated circuits formed on the wafer 6, the number of electrodes to be inspected in each integrated circuit, and the like. However, the number is, for example, 16, 32, 64 or 128.

In the inspection apparatus having such a probe for circuit inspection, the probe for circuit inspection is electrically connected to electrodes 7 to be inspected of a plurality of integrated circuits selected from among all the integrated circuits formed on the wafer 6 to conduct inspection. Thereafter, the probe for circuit inspection is electrically connected to electrodes 7 to be inspected of a plurality of integrated circuits selected from among other integrated circuits to conduct inspection. This process is repeated, whereby electrical inspection of all the integrated circuits formed on the wafer 6 can be conducted.

According to such an inspection apparatus, the numbers of inspection electrodes and wires in a circuit board for inspection used can be lessened compared with a method of collectively conducting inspection as to all integrated circuits in the case where electrical inspection is conducted as to integrated circuits formed in a high degree of integration on a wafer having a diameter of 8 or 12 inches, whereby production cost of the inspection apparatus can be reduced.

(2) In addition to the conductive parts 36 formed in accordance with the pattern corresponding to the pattern of the electrodes 7 to be inspected, conductive parts for non-connection that are not electrically connected to any electrode 7 to be inspected may be formed in the anisotropically conductive sheets 35 in the anisotropically conductive connector 30.

(3) The circuit device, which is an object of inspection by the inspection apparatus according to the present invention, is not limited to the wafer, on which a great number of integrated circuits have been formed, and the inspection apparatus may be constructed as an inspection apparatus for circuits formed in a semiconductor chip, a packaged LSI such as BGA and CSP, a semiconductor integrated circuit device such as CMC, or the like.

EXAMPLES

The present invention will hereinafter be described specifically by the following examples. However, the present invention is not limited to these examples.

[Production of Wafer for Test]

Figure 44:
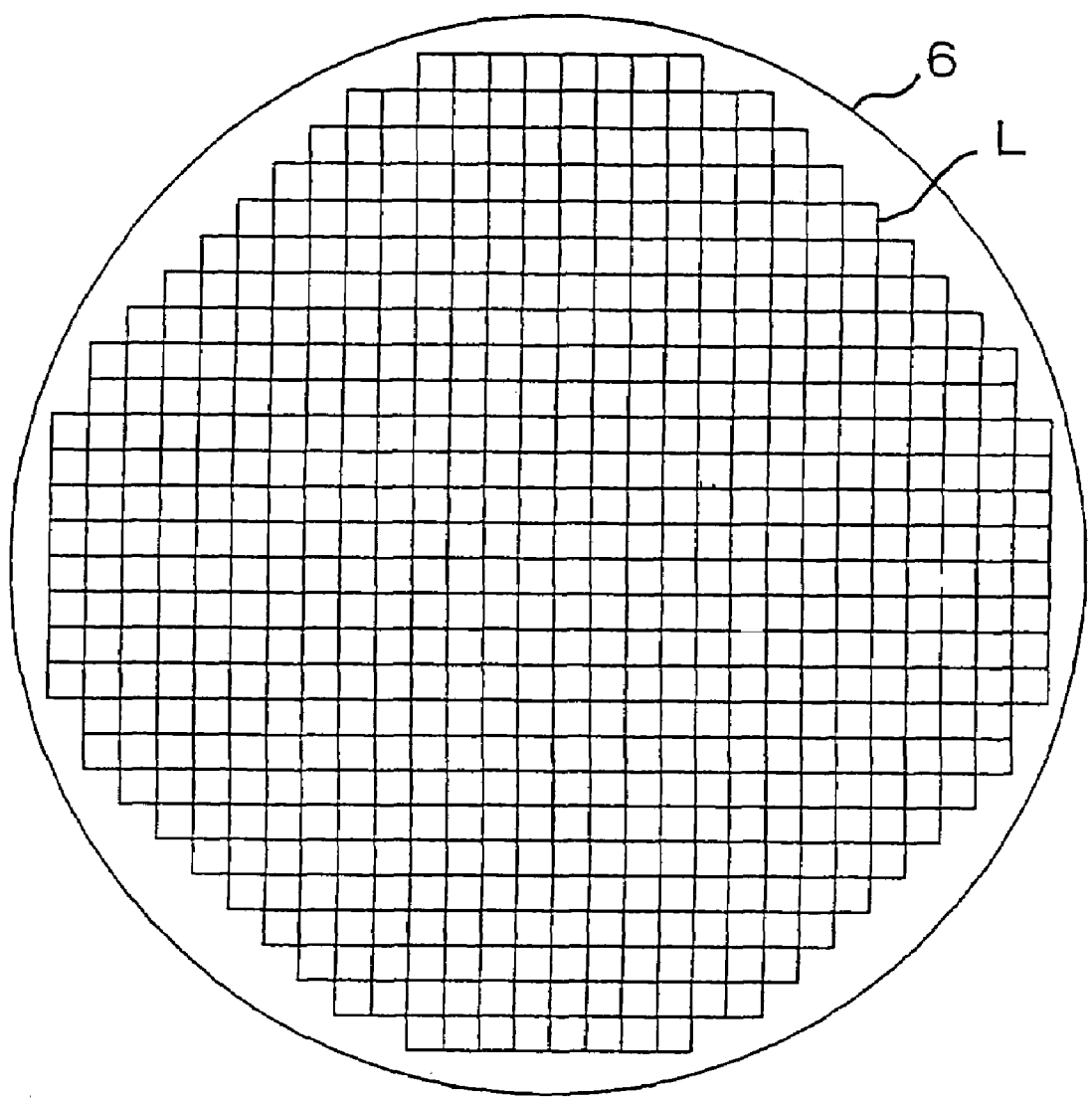
FIG. 44 is a plan view illustrating a wafer for test fabricated in Example.
Figure 45:
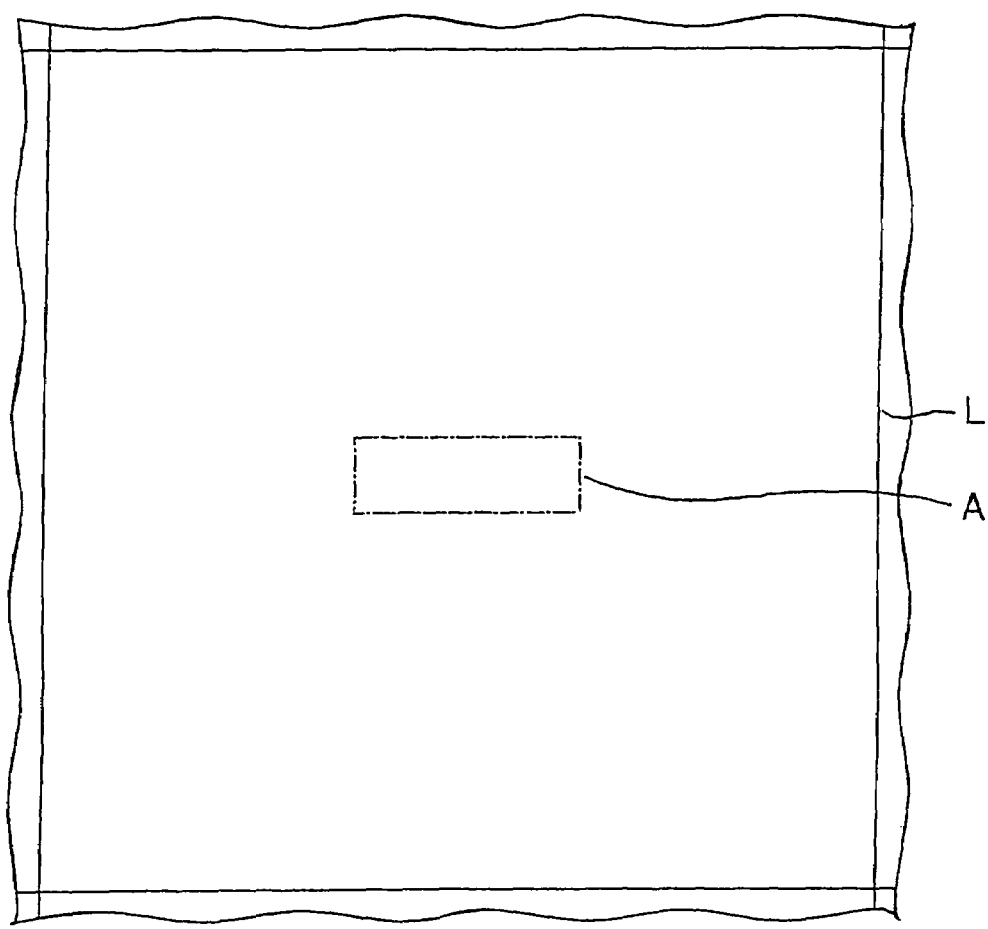
FIG. 45 illustrates a position of a region of electrodes to be inspected of integrated circuits formed on the wafer for test shown in FIG. 44.
Figure 46:
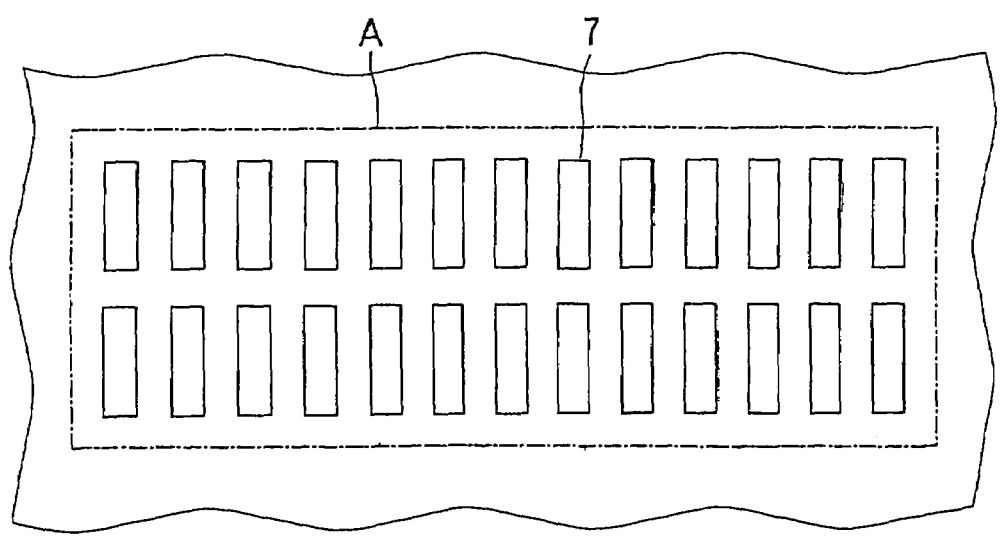
FIG. 46 illustrates an arrangement pattern of the electrodes to be inspected of the integrated circuits formed on the wafer for test shown in FIG. 44.

As illustrated in FIG. 44, 596 square integrated circuits L in total, which each had dimensions of 6.5 mm×6.5 mm, were formed on a wafer 6 made of silicon (coefficient of linear thermal expansion: $3.3 \times 10^{-6}$/K) and having a diameter of 8 inches. Each of the integrated circuits L formed on the wafer 6 has a region A of electrodes to be inspected at its center as illustrated in FIG. 45. In the region A of the electrodes to be inspected, 26 rectangular electrodes 7 to be inspected each having dimensions of 200 μm in a vertical direction (upper and lower direction in FIG. 46) and 80 μm in a lateral direction (left and right direction in FIG. 46) are arranged at a pitch of 120 μm in 2 lines (the number of electrodes 7 to be inspected in one line: 13) in the lateral direction. A clearance between electrodes 7 to be inspected adjoining in the vertical direction is 450 μm. Every 2 electrodes of the 26 electrodes 7 to be inspected are electrically connected to each other. The total number of the electrodes 7 to be inspected on the whole wafer 6 is 15,496. This wafer will hereinafter be referred to as "Wafer W1 for test".

Example 1

[Production of Sheet-Like Connectors M(1-1) to M(1-5)]:

A laminated polyimide sheet with copper layers each having a thickness of 5 μm laminated on both sides of a polyimide sheet having a thickness of 12.5 μm and a laminated thermoplastic polyimide sheet with a copper layer having a thickness of 5 μm laminated on one side of a thermoplastic polyimide sheet were provided, they were arranged in such a manner that a surface of the laminated thermoplastic polyimide sheet, on which no copper layer was not laminated, faces the surface of one copper layer of the laminated polyimide sheet, and both sheets were subjected to a pressure-bonding treatment under heat, thereby producing a laminate material (10A) of the construction shown in FIG. 3.

The resultant laminated material (10A) is such that a first front surface-side metal layer (19A) composed of copper and having a thickness of 5 μm, an insulating layer (16B) composed of polyimide and having a thickness of 25 μm and a second front surface-side metal layer (16A) composed of copper and having a thickness of 5 μm are laminated on a front surface of an insulating sheet (11) composed of polyimide and having a thickness of 12.5 μm in this order, and a back surface-side metal layer (17A) composed of copper and having a thickness of 5 μm is laminated on a back surface of the insulating sheet (11).

To the laminate material (10A), a resist film (12A) was formed on the whole surface of the second front surface-side metal layer (16A) by a dry film resist having a thickness of 25 μm, and a resist film (13), in which 15,496 patterned circular holes (13K) having a diameter of 60 μm had been formed in accordance with a pattern corresponding to a pattern of the electrodes to be inspected formed on Wafer W1 for test, was formed on the surface of the back surface-side metal layer (17A) (see FIG. 4). In the formation of the resist film (13), an exposure treatment was conducted by irradiation of ultraviolet light of 80 mJ by a high-pressure mercury lamp, and a development treatment was conducted by repeating a process of immersing the laminate material for 40 seconds in a developer composed of a 1% aqueous solution of sodium hydroxide twice.

The back surface-side metal layer (17A) was then subjected to an etching treatment with a ferric chloride etchant under conditions of 50° C. for 30 seconds, thereby forming, in the back surface-side metal layer (17A), 15,496 through-holes (17H) linked to the respective patterned holes (13K) in the resist film (13) (see FIG. 5). Thereafter, the insulating sheet (11) was subjected to an etching treatment with a hydrazine etchant under conditions of 60° C. for 120 minutes, thereby forming, in the insulating sheet (11), 15,496 through-holes (11H) linked to the respective through-holes (17K) in the back surface-side metal layer (17A) (see FIG. 6). Each of the through-holes (11H) was in a tapered form that the diameter becomes gradually small from the back surface of the insulating sheet (11) toward the front surface thereof, an opening diameter on the back surface side was 60 μm, and an opening diameter on the front surface side was 45 μm.

Thereafter, the first front surface-side metal layer (19A) was subjected to an etching treatment with a ferric chloride etchant under conditions of 50° C. for 30 seconds, thereby forming, in the first front surface-side metal layer (19A), 15,496 through-holes (19H) linked to the respective through-holes (11K) in the insulating sheet (11) (see FIG. 7). Further, the insulating layer (16B) was subjected to an etching treatment with a hydrazine etchant under conditions of 60° C. for 120 minutes, thereby forming, in the insulating layer (16B), 15,496 through-holes 16H linked to the respective through-holes (19H) in the first front surface-side metal layer (19A) (see FIG. 8). Each of the through-holes (16H) was in a tapered form that the diameter becomes gradually small from the back surface of the insulating layer (16B) toward the front surface thereof, an opening diameter on the back surface side was 45 μm, and an opening diameter on the front surface side was 17 μm.

In such a manner, 15,496 recesses (10K) for forming electrode structures with the respective through-holes (17H) in the back surface-side metal layer (17A), the respective through-holes (11H) in the insulating sheet (11) the respective through-holes (19H) in the first front surface-side metal layer (19A) and the respective through-holes (16H) in the insulating layer (16B) linked to one another were formed in the back surface of the laminate material (10A).

After the resist films (12A and 13) were removed from the laminate material (10A), in which the recesses (10K) for forming electrode structures had been formed, by immersing the laminate material (10A) for 2 minutes in a sodium hydroxide solution at 45° C., a resist film (12B) was formed with a dry film resist having a thickness of 25 μm on the laminate material (10A) so as to cover the whole surface of the second front surface-side metal layer (16A) and a resist film (14A), in which 15,496 patterned rectangular holes (14K) having dimensions of 150 μm×60 μm and linked to the respective through-holes (17H) in the back surface-side metal layer (17A) had been formed, was formed on the surface of the back surface-side metal layer (17A) (see FIG. 9). In the formation of the resist film (14A), an exposure treatment was conducted by irradiation of ultraviolet light of 80 mJ by a high-pressure mercury lamp, and a development treatment was conducted by repeating a process of immersing the laminate material for 40 seconds in a developer composed of a 1% aqueous solution of sodium hydroxide twice.

The laminate material (10A) was then immersed in a plating bath containing nickel sulfamate to subject the laminate material (10A) to an electroplating treatment by using the second front surface-side metal layer (16A) as an electrode to fill a metal into the respective recesses (10K) for forming electrode structures and the respective patterned holes (14K) in the resist film (14A), thereby forming back-surface electrode parts (17) linked to one another through front-surface electrode parts (16), short circuit parts (18) and the back surface-side metal layer (17A) (see FIG. 10).

Figure 11:
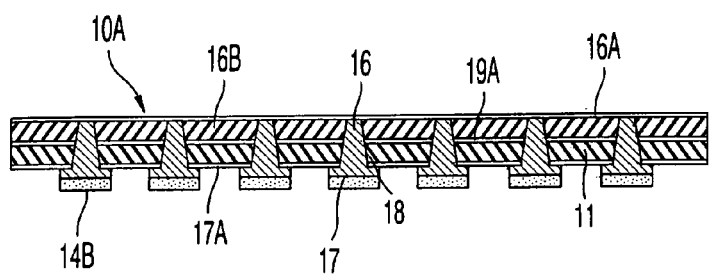
FIG. 11 is a cross-sectional view illustrating a state that resist films have been formed on surface of back-surface electrode parts.

After the laminate material (10A), in which the front-surface electrode parts (16), short circuit parts (18) and back-surface electrode parts (17) had been formed in such a manner, was immersed for 2 minutes in a sodium hydroxide solution at 45° C. to remove the resist films (12B and 14A) from the laminate material (10A), a patterned resist film (14B) for etching was formed with a dry film resist having a thickness of 25 µm so as to cover the back-surface electrode parts (17) (see FIG. 11). In the formation of the resist film (14B), an exposure treatment was conducted by irradiation of ultraviolet light of 80 mJ by a high-pressure mercury lamp, and a development treatment was conducted by repeating a process of immersing the laminate material for 40 seconds in a developer composed of a 1% aqueous solution of sodium hydroxide twice. Thereafter, the second front surface-side metal layer (16A) and the back surface-side metal layer (17A) were subjected to an etching treatment with an ammonia etchant under conditions of 50° C. for 30 seconds, thereby removing the whole of the second front surface-side metal layer (16A) and moreover exposed portions of the back surface-side metal layer (17A) to separate the back-surface electrode parts (17) from one another (see FIG. 12).

Figure 15:
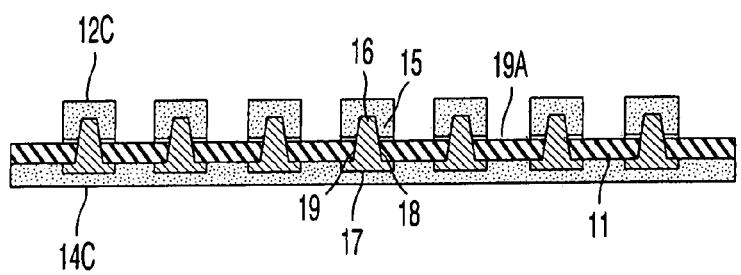
FIG. 15 is a cross-sectional view illustrating a state that the first front surface-side metal layer has been subjected to an etching treatment to form holding parts.

The insulating layer (16B) was then subjected to an etching treatment with a hydrazine etchant under conditions of 60° C. for 120 minutes to remove the insulating layer (16B) and moreover the resist film (14B), thereby exposing the front-surface electrode parts (16), first front surface-side metal layer (19A) and back-surface electrode parts (17) (see FIG. 13). Thereafter, a patterned resist film (12C) was formed with a dry film resist having 25 µm so as to cover the front-surface electrode parts (16) and portions to become holding parts (19) in the first front surface-side metal layer (19A), and a resist film (14C) was formed so as to cover the back surface of the insulating sheet (11) and all of the back-surface electrode parts (17) (see FIG. 14). In the formation of the resist film (12C), an exposure treatment was conducted by irradiation of ultraviolet light of 80 mJ by a high-pressure mercury lamp, and a development treatment was conducted by repeating a process of immersing the laminate material for 40 seconds in a developer composed of a 1% aqueous solution of sodium hydroxide twice. The first front surface-side metal layer (19A) was then subjected to an etching treatment with a ferric chloride etchant under conditions of 50° C. for 30 seconds, thereby forming disc ring-like holding parts (19) each continuously extending from a peripheral surface of a base end portion of the front-surface electrode part (16) outward and radially along the front surface of the insulating sheet (11), thus resulting in the formation of the electrode structures (15) (see FIG. 15).

The resist films (12C) was then removed from the front-surface electrode parts (16) and holding parts (19) and the resist film (14C) was removed from the back surface of the insulating sheet (11) and the back-surface electrode parts (17), thereby producing a sheet-like connector (10) according to the present invention (see FIG. 1).

The sheet-like connector (10) thus obtained is such that the thickness d of the insulating sheet (11) is 12.5 µm, the shape of the front-surface electrode part (16) in each of the electrode structures (15) is a truncated cone shape, the diameter $R_1$ of a base end thereof is 45 µm, the diameter $R_2$ of a tip end thereof is 17 µm, the projected height h thereof is 25 µm, the shape of the short circuit part (18) is a truncated cone shape, the diameter $R_3$ of one end on the front surface side thereof is 45 µm, the diameter $R_4$ of the other end on the back surface side is 60 µm, the shape of the back-surface electrode part (17) is a rectangular flat plate shape, the width (diameter $R_5$) thereof is 60 µm, the length thereof is 150 µm, the thickness $D_2$ is 30 µm, the shape of the holding part (19) is a circular ring plate form, the outer diameter $R_6$ thereof is 50 µm, and the thickness $D_1$ thereof is 5 µm.

In such a manner, 5 sheet-like connectors in total were produced. These sheet-like connectors are referred to as "Sheet-like Connector M(1-1)" to "Sheet-like Connector M(1-5)".

[Production of Anisotropically Conductive Connector]

(1) Preparation of Magnetic Core Particles:

Commercially available nickel particles (product of Westaim Co., "FC1000") were used to prepare magnetic core particles in the following manner.

An air classifier "Turboclassifier TC-15N" manufactured by Nisshin Engineering Co., Ltd. was used to classify 2 kg of nickel particles under conditions of a specific gravity of 8.9, an air flow of 2.5 m$^3$/min, a rotor speed of 1,600 rpm, a classification point of 25 µm and a feed rate of particles of 16 g/min, thereby collecting 1.8 kg of nickel particles, and 1.8 kg of these nickel particles were further classified under conditions of a specific gravity of 8.9, an air flow of 2.5 m$^3$/min, a rotor speed of 3,000 rpm, a classification point of 10 µm and a feed rate of nickel particles of 14 g/min to collect 1.5 kg of nickel particles.

A sonic sifter "SW-20AT Model" manufactured by Tsutsui Rikagaku Kiki K.K. was then used to further classify 120 g of the nickel particles classified by the air classifier. Specifically, 4 sieves each having a diameter of 200 mm and respectively having opening diameters of 25 µm, 20 µm, 16 µm and 8 µm were superimposed on one another in this order from above. Each of the sieves was charged with 10 g of ceramic balls having a diameter of 2 mm, and 20 g of the nickel particles were placed on the uppermost sieve (opening diameter: 25 µm) to classify them under conditions of 55 Hz for 12 minutes and 125 Hz for 15 minutes, thereby collecting nickel particles captured on the lowest sieve (opening diameter: 8 µm). This process was conducted repeatedly 25 times in total, thereby preparing 110 g of magnetic core particles.

The magnetic core particles thus obtained had a number average particle diameter of 10 µm, a coefficient of variation of particle diameter of 10%, a BET specific surface area of 0.2×10$^3$ m$^2$/kg and a saturation magnetization of 0.6 Wb/m$^2$.

The magnetic core particles are referred to as "Magnetic Core Particles [A]".

[2] Preparation of Conductive Particles:

Into a treating vessel of a powder plating apparatus, were poured 100 g of Magnetic Core Particles [A], and 2 L of 0.32N hydrochloric acid were further added. The resultant mixture was stirred to obtain a slurry containing Magnetic Core Particles [A]. This slurry was stirred at ordinary temperature for 30 minutes, thereby conducting an acid treatment for Magnetic Core Particles [A]. Thereafter, the slurry thus treated was left at rest for 1 minute to precipitate Magnetic Core Particles [A], and a supernatant was removed.

To the Magnetic Core Particles [A] subjected to the acid treatment, were added 2 L of purified water, and the mixture was stirred at ordinary temperature for 2 minutes. The mixture was further then left at rest for 1 minute to precipitate Magnetic Core Particles [A], and a supernatant was removed. This process was further conducted repeatedly twice, thereby conducting a washing treatment for Magnetic Core Particles [A].

To the Magnetic Core Particles [A] subjected to the acid treatment and washing treatment, were added 2 L of a gold plating solution containing gold in a proportion of 20 g/L. The temperature of the treating vessel was raised to 90° C. and the contents were stirred, thereby preparing a slurry. While stirring the slurry in this state, Magnetic Core Particles [A] were subjected to displacement plating with gold. Thereafter, the slurry was left at rest while allowing it to cool, thereby precipitating particles, and a supernatant was removed to prepare conductive particles.

To the conductive particles obtained in such a manner, were added 2 L of purified water, and the mixture was stirred at ordinary temperature for 2 minutes. Thereafter, the mixture was left at rest for 1 minute to precipitate conductive particles, and a supernatant was removed. This process was conducted repeatedly further twice, and 2 L of purified water heated to 90° C. were then added to the particles, and the mixture was stirred. The resultant slurry was filtered through filter paper to collect conductive particles. The conductive particles thus obtained were dried in a dryer set to 90° C.

The resultant conductive particles had a number average particle diameter of 12 μm and a BET specific surface area of $0.15 \times 10^3$ m$^2$/kg, and a value of (mass of gold forming a coating layer/total mass of the conductive particles) was 0.3.

The conductive particles are referred to as "Conductive Particles (a)".

Figure 47:
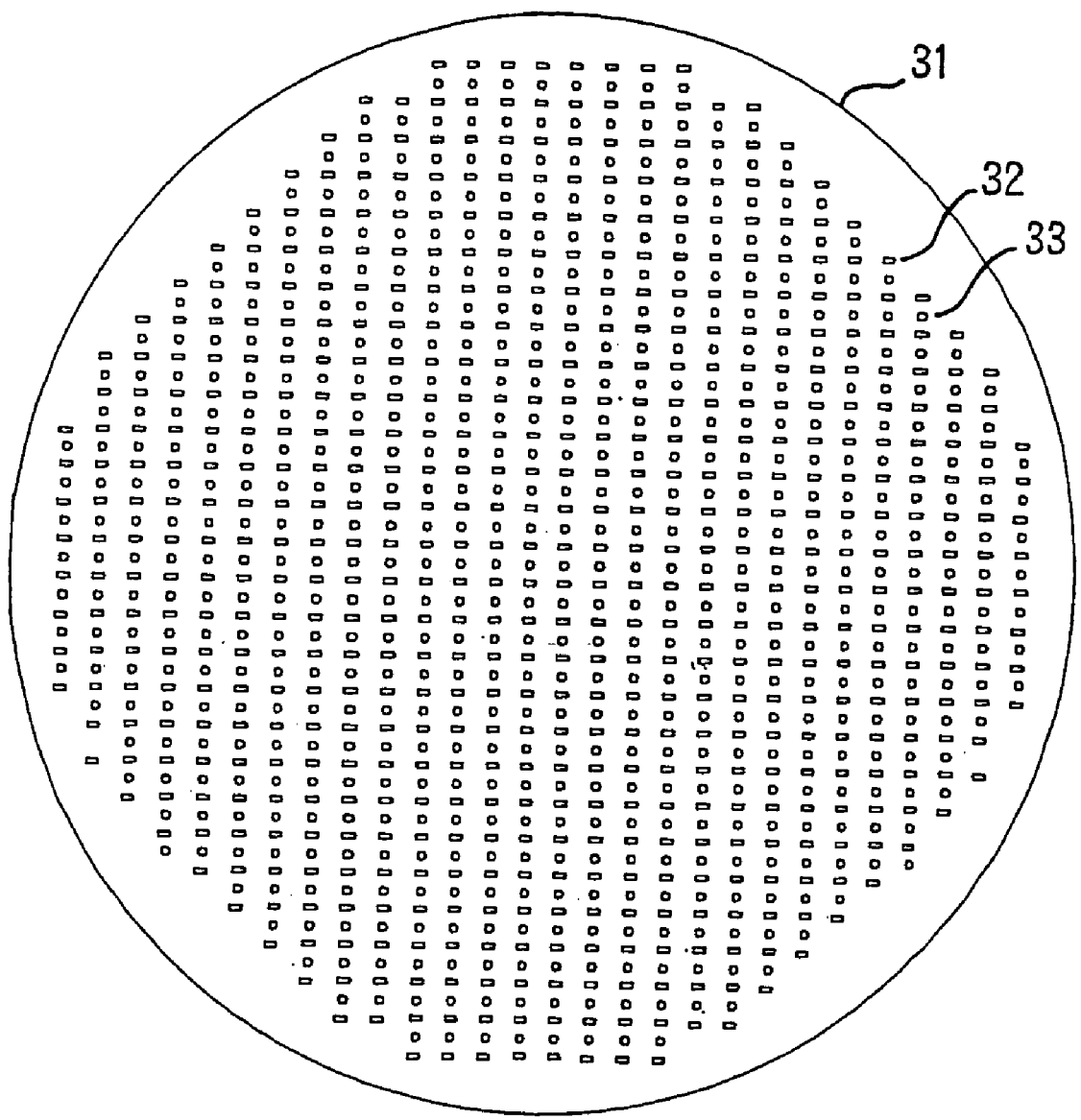
FIG. 47 is a plan view illustrating a frame plate in an anisotropically conductive connector produced in Example.
Figure 48:
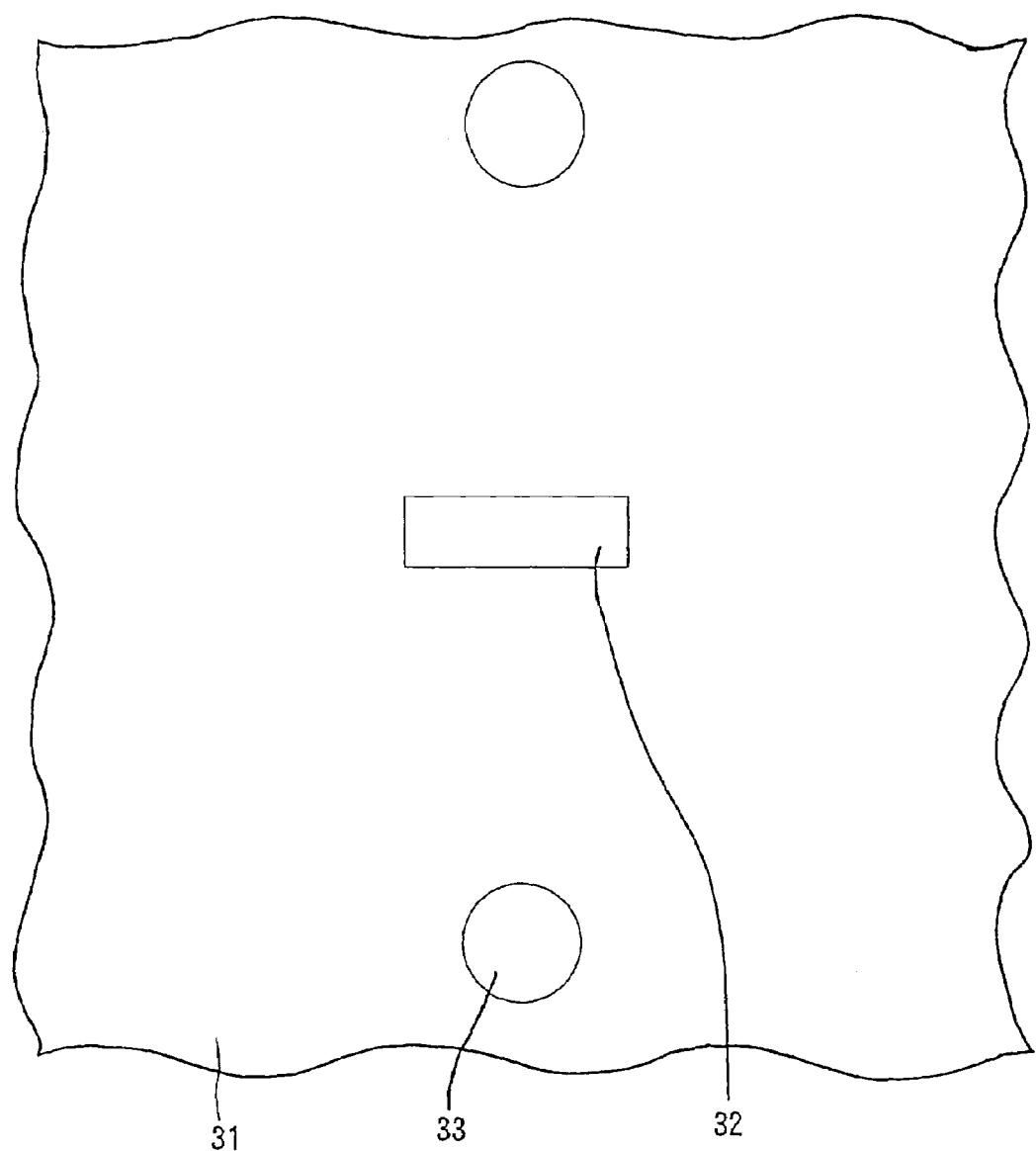
FIG. 48 illustrates, on an enlarged scale, a part of the frame plate shown in FIG. 47.
Figure 49:
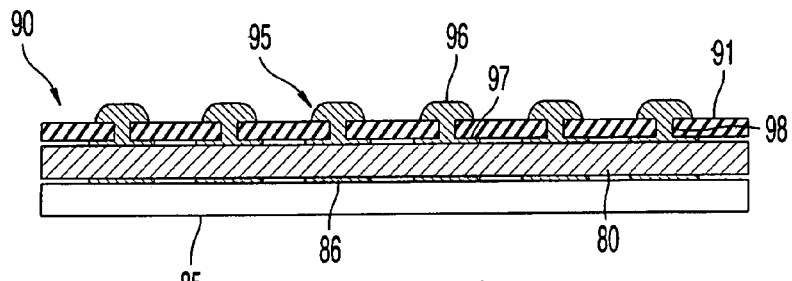
FIG. 49 is a cross-sectional view illustrating the construction of a conventional exemplary probe for circuit inspection.
Figure 50A:
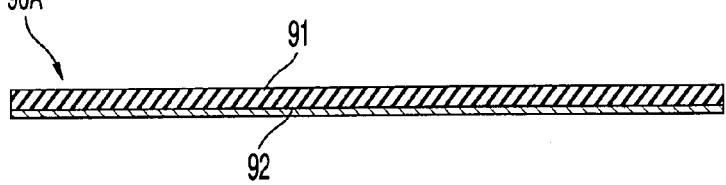
FIG. 50 is a cross-sectional view illustrating a conventional exemplary production process of a sheet-like connector.
Figure 50B:
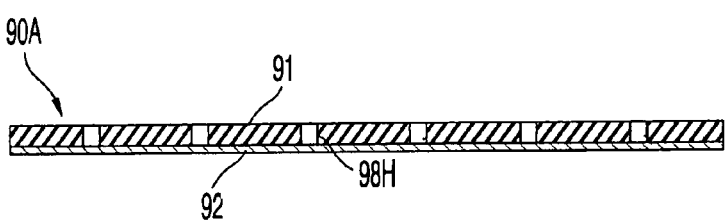
Figure 50C:
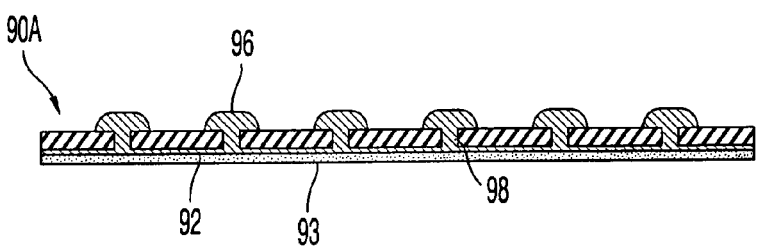
Figure 50D:
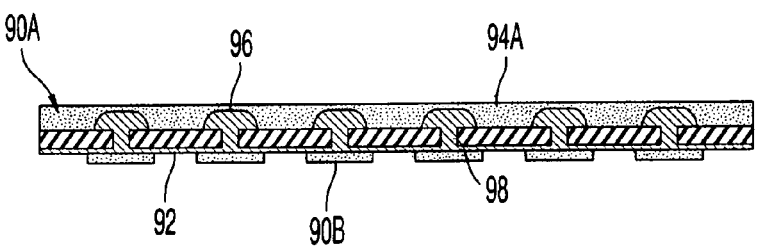
Figure 50E:
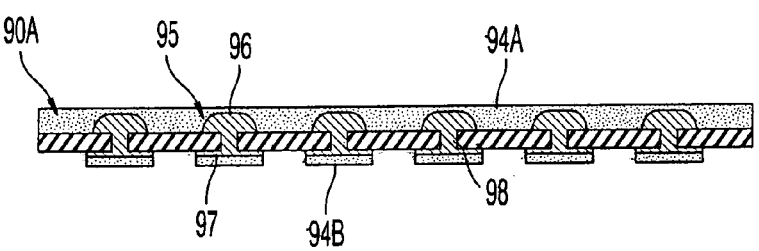
Figure 51:
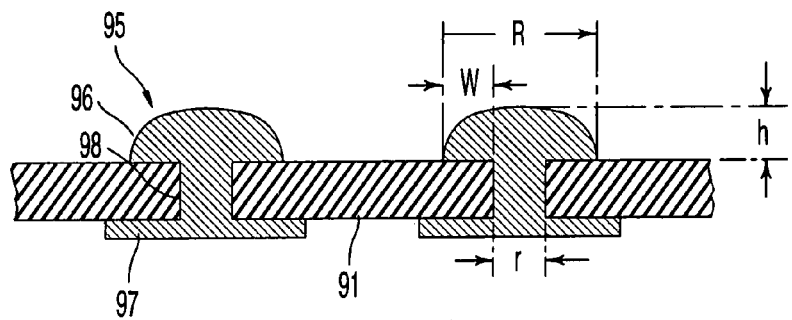
FIG. 51 is a cross-sectional view illustrating, on an enlarged scale, a sheet-like connector in the probe for circuit inspection shown in FIG. 49.
Figure 52A:
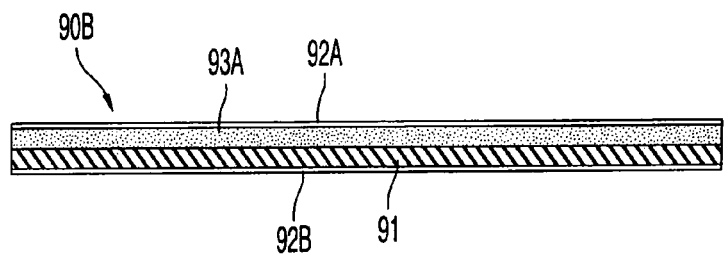
FIG. 52 is a cross-sectional view illustrating another conventional exemplary production process of a sheet-like connector.
Figure 52B:
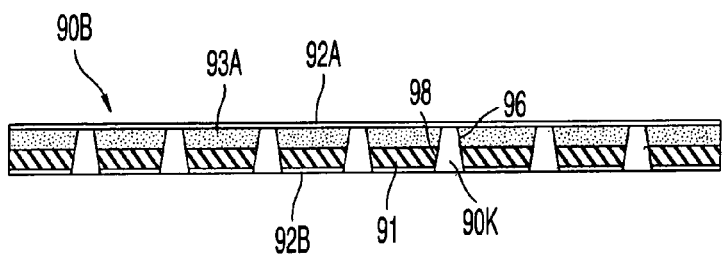
Figure 52C:
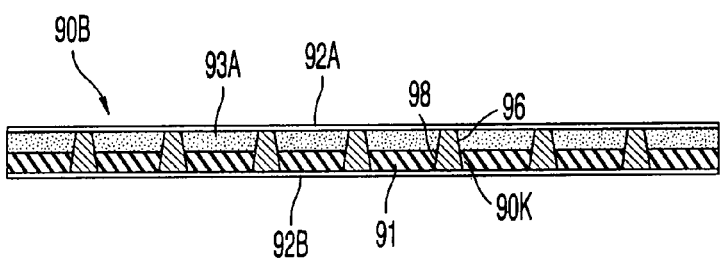
Figure 52D:
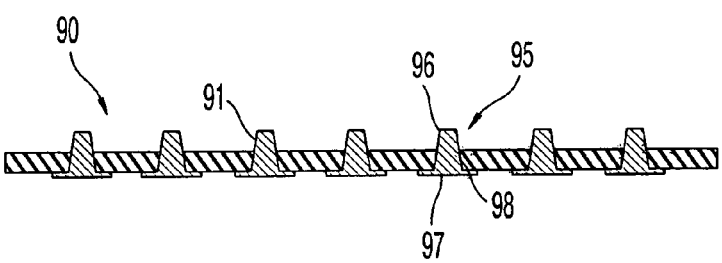
Figure 53A:
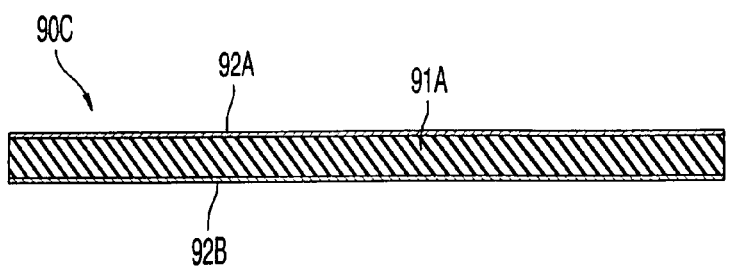
FIG. 53 is a cross-sectional view illustrating a further conventional exemplary production process of a sheet-like connector.
Figure 53B:
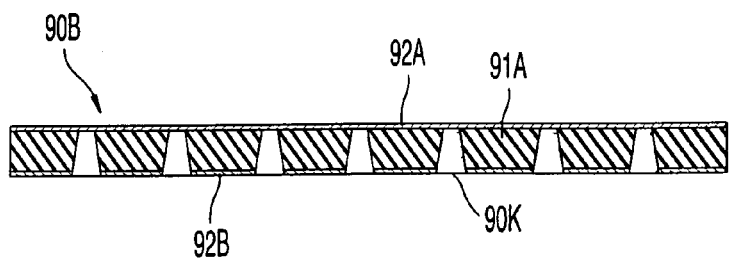
Figure 53C:
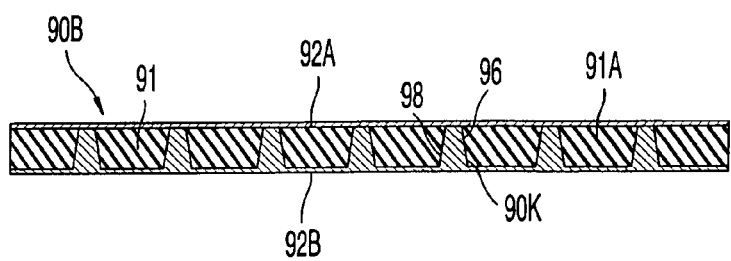
Figure 53D:
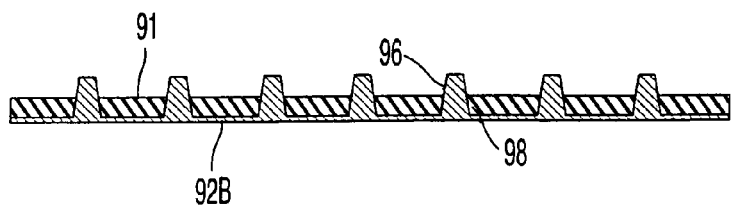
Figure 53E:
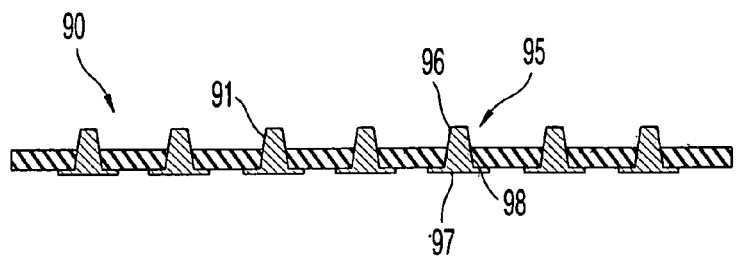

(3) Production of Frame Plate:

A frame plate (31) having a diameter of 8 inches and 596 openings (32) formed corresponding to the respective regions of the electrodes to be inspected in Wafer W1 for test described above was produced under the following conditions in accordance with the construction shown in FIGS. 47 and 48.

A material of this frame plate (31) is covar (coefficient of linear thermal expansion: $5 \times 10^{-6}$/K), and the thickness thereof is 60 μm.

The openings (32) each have dimensions of 1,800 μm in a lateral direction (left and right direction in FIGS. 47 and 48) and 600 μm in a vertical direction (upper and lower direction in FIGS. 47 and 48).

An air inflow hole (33) is formed at a central position between openings (32) adjoining in the vertical direction, and the diameter thereof is 1,000 μm.

(4) Preparation of Molding Material for Anisotropically Conductive Sheet:

To 100 parts by weight of addition type liquid silicone rubber, were added 30 parts by weight of Conductive Particles [a] to mix them. Thereafter, the resultant mixture was subjected to a defoaming treatment by pressure reduction, thereby preparing a molding material for anisotropically conductive sheet.

In the above-described process, the addition type liquid silicone rubber used is of a two-pack type composed of Liquid A and Liquid B each having a viscosity of 250 Pa·s. The cured product thereof has a compression set of 5%, a durometer A hardness of 32 and tear strength of 25 kN/m.

Properties of the addition type liquid silicone rubber and cured product thereof were measured in the following manner.

(i) The viscosity of the addition type liquid silicone rubber was a value measured by means of a Brookfield type viscometer at 23±2° C.

(ii) The compression set of the cured silicone rubber was measured in the following manner.

Liquid A and Liquid B in the two-pack type liquid silicone rubber were stirred and mixed in proportions that their amounts become equal. After the mixture was then poured into a mold and subjected to a defoaming treatment by pressure reduction, it was subjected to a curing treatment under conditions of 120° C. for 30 minutes, thereby forming a columnar body composed of a cured product of the silicone rubber and having a thickness of 12.7 mm and a diameter of 29 mm. This columnar body was post-cured under conditions of 200° C. for 4 hours. The columnar body obtained in such a manner was used as a specimen to measure a compression set at 150±2° C. in accordance with JIS K 6249.

(iii) The tear strength of the cured silicone rubber was measured in the following manner.

The curing treatment and post-curing of the addition type liquid silicone rubber were conducted under the same conditions as those in the item (ii) to form a sheet having a thickness of 2.5 mm. A crescent type specimen was produced by punching from this sheet to measure its tear strength at 23±2° C. in accordance with JIS K 6249.

(iv) The durometer A hardness was determined by using, as a specimen, a laminate obtained by stacking 5 sheets produced in the same manner as in the item (iii) on one another, and measuring a value at 23±2° C. in accordance with JIS K 6249.

(5) Production of Anisotropically Conductive Connector:

The frame plate (31) produced in the item (1) and the molding material prepared in the item (4) were used to form 596 anisotropically conductive sheets (35) of the construction shown in FIG. 42, which were arranged so as to close the respective openings in the frame plate (31) and fixed to and supported by respective opening edges of the frame plate (31), in accordance with the process described in Japanese Patent Application Laid-Open No. 2002-324600, thereby producing an anisotropically conductive connector. The curing treatment of the molding material layers was conducted under conditions of 100° C. for 1 hour while applying a magnetic field of 2 T by electromagnets.

The resultant anisotropically conductive sheets (35) will be described specifically. Each of the anisotropically conductive sheets (35) has dimensions of 2,500 μm in a lateral direction and 1,400 μm in a vertical direction, and 26 conductive parts (36) are arranged at a pitch of 120 μm in 2 lines (the number of conductive parts in one line: 13; clearance between conductive parts adjoining in the vertical direction: 450 μm) in the lateral direction. With respect to each of the conductive parts (36), its dimensions are 60 μm in the lateral direction and 200 μm in the vertical direction, the thickness is 150 μm, the projected height of the projected portion (38) is 25 μm, and the thickness of the insulating part (37) is 100 μm. Conductive parts for non-connection are arranged between the conductive part (36) located most outside in the lateral direction and the opening edge of the frame plate. Each of the conductive parts for non-connection has dimensions of 80 μm in the lateral direction and 300 μm in the vertical direction and a thickness of 150 μm.

The content of the conductive particles in the conductive parts (36) in each of the anisotropically conductive sheets (35) was investigated. As a result, the content was about 30% in terms of a volume fraction in all the conductive parts (36).

The resultant anisotropically conductive connector is referred to as "Anisotropically Conductive Connector C1".

(6) Production of Circuit Board for Inspection:

Alumina ceramic (coefficient of linear thermal expansion: $4.8 \times 10^{-6}$/K) was used as a board material to produce a circuit board (20) for inspection, in which inspection electrodes (21) had been formed in accordance with a pattern corresponding to the pattern of the electrodes to be inspected in Wafer W1 for test. This circuit board (20) for inspection has dimensions of 30 cm×30 cm as a whole and is rectangular. The inspection electrodes thereof each have dimensions of 60 μm in the lateral direction and 200 μm in the vertical direction. The resultant circuit board for inspection is referred to as "Circuit Board T1 for inspection".

(7) Connection Stability Test:

Sheet-like Connector M(1-1) to Sheet-Like Connector M(1-5) were respectively subjected to a connection stability test in the following manner.

Wafer W1 for test was arranged on a test table, a sheet-like connector was arranged on the surface of Wafer W1 for test in alignment in such a manner that the respective front-surface electrode parts thereof are located on electrodes to be inspected of Wafer W1 for test, and Anisotropically Conductive Connector C1 was arranged on this sheet-like connector in alignment in such a manner that the respective conductive parts thereof are located on the back-surface electrode parts of the sheet-like connector. Circuit Board T1 for inspection was arranged on this anisotropically conductive connector in alignment in such a manner that the respective inspection electrodes thereof are located on the conductive parts of the anisotropically conductive connector. Further, Circuit Board T1 for inspection was pressurized downward under a load of 12.4 kg (load applied to every conductive part of the anisotropically conductive connector: 0.8 g on the average).

With respect to 15,496 inspection electrodes in Circuit Board T1 for test, an electric resistance between every two inspection electrodes electrically connected to each other through Anisotropically Conductive Connector C1, the sheet-like connector and Wafer W1 for test was measured successively at room temperature (25° C.), and a half value of the electric resistance value measured was recorded as an electric resistance (hereinafter referred to as "conduction resistance") between an inspection electrode of Circuit Board T1 for inspection and an electrode to be inspected of Wafer W1 for test to find a proportion of measuring points, at which the conduction resistance was lower than 1 Ω, to all measuring points.

Further, a proportion of measuring points, at which the conduction resistance was lower than 1 Ω, to all measuring points was found in the same manner as described above except that the load applied to Circuit Board T1 for inspection was changed from 12.4 kg to 31 kg (load applied to every conductive part of the anisotropically conductive connector: 2 g on the average).

The results are shown in Table 1.

(8) Durability Test:

Sheet-like Connector M(1-1), Sheet-like Connector M(1-2) and Sheet-like Connector M(1-4) were respectively subjected to a durability test in the following manner.

Wafer W1 for test was arranged on a test table equipped with an electric heater, a sheet-like connector was arranged on the surface of Wafer W1 for test in alignment in such a manner that the respective front-surface electrode parts thereof are located on electrodes to be inspected of Wafer W1 for test, and Anisotropically Conductive Connector C1 was arranged on this sheet-like connector in alignment in such a manner that the respective conductive parts thereof are located on the back-surface electrode parts of the sheet-like connector. Circuit Board T1 for inspection was arranged on this anisotropically conductive connector in alignment in such a manner that the respective inspection electrodes thereof are located on the conductive parts of the anisotropically conductive connector. Further, Circuit Board T1 for inspection was pressurized downward under a load of 31 kg (load applied to every conductive part of the anisotropically conductive connector: 2 g on the average). After the test table was then heated to 85° C., and the temperature of the test table became stable, an electric resistance between every two inspection electrodes electrically connected to each other through Anisotropically Conductive Connector C1, the sheet-like connector and Wafer W1 for test among 15,496 inspection electrodes in Circuit Board T1 for inspection was measured successively, and a half value of the electric resistance value measured was recorded as an electric resistance (hereinafter referred to as "conduction resistance") between an inspection electrode of Circuit Board T1 for inspection and an electrode to be inspected of Wafer W1 for test to count the number of measuring points, at which the conduction resistance was 1 Ω or higher. After retained for 30 seconds in this state, the pressurization to Circuit Board T1 for inspection was released while retaining the temperature of the test table at 85° C., and Circuit Board T1 for inspection was retained for 30 seconds in this state. This process was regarded as a cycle, and the cycle was repeated 50,000 times in total.

The results are shown in Table 2.

After the above-described durability test was completed, Sheet-like Connector M(1-1), Sheet-like Connector M(1-2) and Sheet-like Connector M(1-4) were respectively observed. As a result, it was confirmed that none of the electrode structures fell off from the insulating sheet, and so these sheet-like connectors have high durability.

Comparative Example 1

A sheet-like connector was produced in the same manner as in Example 1 except that the whole of the first front surface-side metal layer was removed by the etching treatment to form no holding part in the production of the sheet-like connector.

The sheet-like connector thus obtained is such that the thickness d of the insulating sheet is 12.5 μm, the shape of the front-surface electrode part in each of the electrode structures is a truncated cone shape, the diameter of a base end thereof is 45 μm, the diameter of a tip end thereof is 17 μm, the projected height thereof is 25 μm, the shape of the short circuit part is a truncated cone shape, the diameter of one end on the front surface side thereof is 45 μm, the diameter of the other end on the back surface side is 60 μm, the shape of the back-surface electrode part is a rectangular flat plate shape, the width thereof is 60 μm, the length thereof is 150 μm, and the thickness is 30 μm.

In such a manner, 5 sheet-like connectors in total were produced. These sheet-like connectors are referred to as "Sheet-like Connector M(2-1)" to "Sheet-like Connector M(2-5)".

Sheet-like Connector M(2-1) to Sheet-like Connector M(2-5) were subjected to the connection stability test in the same manner as in Example 1. The results are shown in Table 1.

Sheet-like Connector M(2-1) and Sheet-like Connector M(2-3) were subjected to the durability test in the same manner as in Example 1. The results are shown in Table 2.

After the durability test was completed, Sheet-like Connector M(2-1) and Sheet-like Connector M(2-3) were respectively observed. As a result, it was found that 52 electrode structures among 15,496 electrode structure in Sheet-like Connector M(2-1) fell off from the insulating sheet, and 16 electrode structures among 15,496 electrode structure in Sheet-like Connector M(2-3) fell off from the insulating sheet.

Comparative Example 2

A sheet-like connector was produced in the following manner in accordance with the process shown in FIG. 50.

A laminate material was provided by laminating a copper layer having a thickness of 5 μm on one surface of an insulating sheet formed of polyimide and having a thickness of 12.5 μm, and 15,496 through-holes each extending through in the thickness-wise direction of the insulating sheet and having a diameter of 30 μm were formed in the insulating sheet of the laminate material in accordance with a pattern corresponding to the pattern of electrodes to be inspected in Wafer W1 for test by subjecting the insulating sheet to laser machining. This laminate material was then subjected to photolithography and plating treatment with nickel, whereby short circuit parts integrally linked to the copper layer were formed in the through-holes in the insulating sheet, and at the same time, protruding front-surface electrode parts integrally linked to the respective short circuit parts were formed on the front surface of the insulating sheet. The diameter of a base end of each of the front-surface electrode parts was 70 μm, and the height from the surface of the insulating sheet was 20 μm. Thereafter, the copper layer of the laminate material was subjected to a photo-etching treatment to remove a part thereof, thereby forming rectangular back-surface electrode parts having dimensions of 60 μm×150 μm. Further, the front-surface electrode parts and back-surface electrode parts were subjected to a plating treatment with gold, thereby forming electrode structures, thus resulting in the production of a sheet-like connector.

In such a manner, 5 sheet-like connectors in total were produced. These sheet-like connectors are referred to as "Sheet-like Connector M(3-1)" to "Sheet-like Connector M(3-5)".

Sheet-like Connector M(3-1) to Sheet-like Connector M(3-5) were subjected to the connection stability test in the same manner as in Example 1. The results are shown in Table 1.

Sheet-like Connector M(3-1), Sheet-like Connector M(3-2) and Sheet-like Connector M(3-4) were subjected to the durability test in the same manner as in Example 1. The results are shown in Table 2.

TABLE 1

|  |  | Proportion of measuring points, at which the conduction resistance was lower than 1 Ω, to all measuring points (%) | |
| --- | --- | --- | --- |
|  |  | Load: 12.4 kg | Load: 31 kg |
| Example 1 | Sheet-like Connector M (1-1) | 100 | 100 |
|  | Sheet-like Connector M (1-2) | 100 | 100 |
|  | Sheet-like Connector M (1-3) | 100 | 100 |
|  | Sheet-like Connector M (1-4) | 100 | 100 |
|  | Sheet-like Connector M (1-5) | 100 | 100 |
| Comparative Example 1 | Sheet-like Connector M (2-1) | 100 | 100 |
|  | Sheet-like Connector M (2-2) | 96 | 96 |
|  | Sheet-like Connector M (2-3) | 100 | 100 |
|  | Sheet-like Connector M (2-4) | 99 | 99 |
|  | Sheet-like Connector M (2-5) | 92 | 95 |
| Comparative Example 2 | Sheet-like Connector M (3-1) | 89 | 100 |
|  | Sheet-like Connector M (3-2) | 93 | 100 |
|  | Sheet-like Connector M (3-3) | 77 | 97 |
|  | Sheet-like Connector M (3-4) | 90 | 100 |
|  | Sheet-like Connector M (3-5) | 88 | 97 |

|  |  | | Number of points at which the conduction resistance was 1 Ω or higher (count) | | | | |
| --- | --- | --- | --- | --- | --- | --- | --- |
|  | Number of cycle(s) | 1 time | 1,000 times | 5,000 times | 10,000 times | 30,000 times | 50,000 times |
| Example 1 | Sheet-like Connector M(1-1) | 0 | 0 | 0 | 0 | 0 | 0 |
|  | Sheet-like Connector M(1-2) | 0 | 0 | 0 | 0 | 0 | 0 |
|  | Sheet-like Connector M(1-4) | 0 | 0 | 0 | 0 | 0 | 0 |
| Comparative Example 1 | Sheet-like Connector M(2-1) | 0 | 2 | 4 | 38 | 74 | 128 |
|  | Sheet-like Connector M(2-3) | 0 | 0 | 2 | 18 | 32 | 42 |
| Comparative Example 2 | Sheet-like Connector M(3-1) | 0 | 0 | 0 | 0 | 0 | 0 |
|  | Sheet-like Connector M(3-2) | 0 | 0 | 0 | 0 | 4 | 16 |
|  | Sheet-like Connector M(3-4) | 0 | 0 | 0 | 2 | 2 | 8 |

As apparent from the results shown in Table 1, it was confirmed that according to Sheet-like Connector M(1-1) to Sheet-like Connector M(1-5) of Example 1, a stable electrically connected state is surely achieved to all electrodes to be inspected by a small load.

It was also confirmed that the sheet-like connectors according to Example 1 have high durability.

What is claimed is:

1. A sheet-like connector comprising an insulating sheet and a plurality of electrode structures arranged in the insulating sheet in a state separated from one another in a plane direction of the insulating sheet and extending through in a thickness-wise direction of the insulating sheet, wherein each of the electrode structures includes, a front-surface electrode part exposed to a front surface of the insulating sheet and projected from the front surface of the insulating sheet, a back-surface electrode part exposed to a back surface of the insulating sheet, a short circuit part continuously extending from the base end of the front-surface electrode part through the insulating sheet in the thickness-wise direction thereof and linked to the back-surface electrode part, the front-surface electrode part and the short circuit part formed of a metal, and a holding part continuously extending from a base end portion of the front-surface electrode part outward along the front surface of the insulating sheet, and including a metal layer having a thickness of 3 to 12 µm formed on the insulating material, the metal forming the front-surface electrode part and the short circuit part is a different metal than the metal forming the holding part.

2. The sheet-like connector according to claim 1, wherein the front-surface electrode part in the electrode structure has a shape that the diameter becomes gradually small from the base end thereof toward the tip end.

3. The sheet-like connector according to claim 1, wherein the value of a ratio $R_2/R_1$ of the diameter $R_2$ of the tip end of the front-surface electrode part in the electrode structure to the diameter $R_1$ of the base end of the front-surface electrode part is 0.11 to 0.55.

4. The sheet-like connector according to claim 1, wherein the value of a ratio $h/R_1$ of the projected height h of the front-surface electrode part in the electrode structure to the diameter $R_1$ of the base end of the front-surface electrode part is 0.2 to 3.

5. The sheet-like connector according to claim 1, wherein the short circuit part in the electrode structure has a shape that the diameter becomes gradually small from the back surface of the insulating sheet toward the front surface thereof.

6. The sheet-like connector according to claim 1, wherein the insulating sheet is composed of an etching-capable polymeric material.

7. The sheet-like connector according to claim 6, wherein the insulating sheet is composed of polyimide.

8. A probe for circuit inspection for conducting electrical connection between a circuit device that is an object of inspection and a tester, which comprises: a circuit board for inspection, on which a plurality of inspection electrodes have been formed according to electrodes to be inspected of a circuit device, which is an object of inspection, an anisotropically conductive connector arranged on the circuit board for inspection, and the sheet-like connector according to claim 1, which is arranged on the anisotropically conductive connector.

9. The probe for circuit inspection according to claim 8, wherein the circuit device that is the object of inspection is a wafer, on which a great number of integrated circuits have been formed, and the anisotropically conductive connector has a frame plate having a plurality of openings formed correspondingly to electrode regions, in which electrodes to be inspected in the whole or part of the integrated circuits formed on the wafer, which is the object of inspection, have been arranged, and anisotropically conductive sheets arranged so as to close the respective openings in the frame plate.

10. An inspection apparatus for circuit devices, which comprises the probe for circuit inspection according to claim 8.

11. The sheet-like connector according to claim 1, wherein the metal of the front-surface electrode and the short circuit part are formed by plating.

12. The sheet-like connector according to claim 1, wherein the metal layer of the holding part is formed by etching.

13. The sheet-like connector according to claim 1, wherein the metal of the front-surface electrode and the short circuit part are selected from a group consisting of nickel, gold, silver, palladium, and iron, and the metal forming the holding part is copper.

14. An electrode structure comprising:

a front-surface electrode part exposed to a front surface of an insulating sheet and projected from the front surface of the insulating sheet;

a back-surface electrode part exposed to a back surface of the insulating sheet;

a short circuit part continuously extending from the base end of the front-surface electrode part through the insulating sheet in the thickness-wise direction thereof and linked to the back-surface electrode part, the front-surface electrode part and the short circuit part formed of a metal; and a holding part continuously extending from a base end portion of the front-surface electrode part outward along the front surface of the insulating sheet, and including a metal layer having a thickness of 3 to 12 µm formed on the insulating material, the metal forming the front-surface electrode part and the short circuit part is a different metal than the metal forming the holding part.

* * * * *